United States Patent
Chen

(10) Patent No.: US 11,853,152 B2
(45) Date of Patent: Dec. 26, 2023

(54) FAIL BIT REPAIR METHOD AND DEVICE

(71) Applicant: CHANGXIN MEMORY TECHNOLOGIES, INC., Hefei (CN)

(72) Inventor: Yui-Lang Chen, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 84 days.

(21) Appl. No.: 17/445,300

(22) Filed: Aug. 17, 2021

(65) Prior Publication Data

US 2022/0058079 A1 Feb. 24, 2022

Related U.S. Application Data

(63) Continuation of application No. PCT/CN2021/099173, filed on Jun. 9, 2021.

(30) Foreign Application Priority Data

Aug. 18, 2020 (CN) .......................... 202010832381.5

(51) Int. Cl.
G06F 11/00 (2006.01)
G06F 11/07 (2006.01)

(52) U.S. Cl.
CPC ...... *G06F 11/0793* (2013.01); *G06F 11/0727* (2013.01); *G06F 11/0751* (2013.01)

(58) Field of Classification Search
CPC ............. G06F 11/0793; G06F 11/0727; G06F 11/0751

(Continued)

(56) References Cited

U.S. PATENT DOCUMENTS

| 6,535,993 B1 | 3/2003 | Hamada |
| 6,741,509 B2 | 5/2004 | Kato |

(Continued)

FOREIGN PATENT DOCUMENTS

| CN | 1195814 A | 10/1998 |
| CN | 1366308 A | 8/2002 |

(Continued)

OTHER PUBLICATIONS

Supplementary European Search Report in European Application No. 21773439.1, dated Jun. 27, 2022.

(Continued)

*Primary Examiner* — Sarai E Butler
(74) *Attorney, Agent, or Firm* — SYNCODA LLC; Feng Ma

(57) ABSTRACT

A Fail Bit (FB) repair method includes: a bank to be repaired of a chip to be repaired is determined; first repair processing is performed on a first FB using a redundant circuit; a bit position of a second FB in each target repair bank is determined, and second repair processing is performed on the second FB; an unrepaired FB in each target repair bank is determined, and candidate repair combinations of the unrepaired FBs and a candidate combination count are determined; and if the candidate combination count is greater than a combination count threshold, a target repair position is determined, and repair processing is performed on the target repair position using a Redundant Word-Line (RWL), the target repair position being a position of an FB that maximally reduces the candidate combination count after repair processing.

14 Claims, 16 Drawing Sheets

(58) Field of Classification Search
USPC .................................................. 714/1–57
See application file for complete search history.

(56) References Cited

U.S. PATENT DOCUMENTS

| | | | |
|---|---|---|---|
| 6,876,588 B2 | 4/2005 | Kato | |
| 7,079,432 B2 | 7/2006 | Kato | |
| 7,224,596 B2 | 5/2007 | Jeong | |
| 10,446,253 B2 | 10/2019 | Choi | |
| 2001/0009521 A1 | 7/2001 | Hidaka | |
| 2001/0026486 A1 | 10/2001 | Ogawa | |
| 2002/0001896 A1* | 1/2002 | Yoon | G11C 29/808 438/200 |
| 2002/0114198 A1 | 8/2002 | Kato | |
| 2002/0191454 A1 | 12/2002 | Beer | |
| 2003/0191991 A1* | 10/2003 | Hsu | G11C 29/808 714/710 |
| 2004/0062134 A1 | 4/2004 | Kato | |
| 2004/0210803 A1 | 10/2004 | Cheng | |
| 2005/0122802 A1 | 6/2005 | Kato | |
| 2006/0090058 A1 | 4/2006 | Chng | |
| 2006/0098503 A1 | 5/2006 | Jeong | |
| 2007/0247937 A1 | 10/2007 | Moriyama | |
| 2009/0119537 A1 | 5/2009 | Lee | |
| 2010/0157656 A1 | 6/2010 | Tsuchida | |
| 2010/0169705 A1* | 7/2010 | Fujii | G11C 29/72 714/719 |
| 2010/0322024 A1 | 12/2010 | Yagishita | |
| 2011/0002169 A1 | 1/2011 | Li | |
| 2011/0199845 A1 | 8/2011 | Yang | |
| 2012/0173932 A1 | 7/2012 | Li | |
| 2012/0206973 A1 | 8/2012 | He | |
| 2012/0257467 A1 | 10/2012 | Kosugi | |
| 2012/0275249 A1 | 11/2012 | Yang | |
| 2012/0297245 A1 | 11/2012 | Li | |
| 2013/0173970 A1 | 7/2013 | Kleveland | |
| 2014/0146613 A1 | 5/2014 | Yang et al. | |
| 2014/0219023 A1 | 8/2014 | Li et al. | |
| 2015/0066417 A1 | 3/2015 | Kimura | |
| 2015/0178614 A1 | 6/2015 | Lin | |
| 2015/0248322 A1 | 9/2015 | Hara et al. | |
| 2016/0005452 A1* | 1/2016 | Bae | G06F 11/1048 714/764 |
| 2016/0351276 A1 | 12/2016 | Shim | |
| 2017/0110206 A1 | 4/2017 | Ryu et al. | |
| 2018/0182467 A1 | 6/2018 | Kang et al. | |
| 2019/0164621 A1 | 5/2019 | Kim | |
| 2019/0237154 A1* | 8/2019 | Choi | G11C 29/783 |
| 2019/0287641 A1 | 9/2019 | Ko | |
| 2019/0348100 A1 | 11/2019 | Smith et al. | |
| 2019/0348102 A1* | 11/2019 | Smith | G11C 11/406 |
| 2020/0152285 A1 | 5/2020 | Nakaoka | |
| 2020/0243159 A1 | 7/2020 | Kang et al. | |
| 2022/0058079 A1 | 2/2022 | Chen | |
| 2022/0058080 A1 | 2/2022 | Chen | |
| 2022/0059182 A1 | 2/2022 | Chen | |
| 2022/0270668 A1 | 8/2022 | Li et al. | |
| 2022/0310187 A1 | 9/2022 | Chen | |
| 2022/0317908 A1 | 10/2022 | Chen | |

FOREIGN PATENT DOCUMENTS

| | | |
|---|---|---|
| CN | 1404140 A | 3/2003 |
| CN | 1409323 A | 4/2003 |
| CN | 1467746 A | 1/2004 |
| CN | 101329918 A | 12/2008 |
| CN | 101331554 A | 12/2008 |
| CN | 101630337 A | 1/2010 |
| CN | 101765889 A | 6/2010 |
| CN | 102157203 A | 8/2011 |
| CN | 101765889 B | 12/2013 |
| CN | 103473160 A | 12/2013 |
| CN | 103688247 A | 3/2014 |
| CN | 103871447 A | 6/2014 |
| CN | 105787817 A | 7/2016 |
| CN | 109753374 A | 5/2019 |
| CN | 110010187 A | 7/2019 |
| CN | 110364214 A | 10/2019 |
| CN | 110797071 A | 2/2020 |
| CN | 110797072 A | 2/2020 |
| CN | 110879931 A | 3/2020 |
| CN | 110968985 A | 4/2020 |
| CN | 111312321 A | 6/2020 |
| CN | 112216621 A | 1/2021 |
| CN | 112885398 A | 6/2021 |
| CN | 112908402 A | 6/2021 |
| CN | 112908403 A | 6/2021 |
| EP | 1217524 A2 | 6/2002 |
| JP | 2000048596 A | 2/2000 |
| JP | 2008084409 A | 4/2008 |
| KR | 100795520 B1 | 1/2008 |
| TW | 376558 B | 12/1999 |
| TW | 470964 B | 1/2002 |
| TW | 201110132 A | 3/2011 |
| TW | 201642273 A | 12/2016 |

OTHER PUBLICATIONS

International Search Report in the international application No. PCT/CN2021/099159, dated Sep. 8, 2021.
International Search Report in the international application No. PCT/CN2021/099149, dated Sep. 7, 2021.
International Search Report in the international application No. PCT/CN2021/099146, dated Sep. 7, 2021.
International Search Report in the international application No. PCT/CN2021/099173, dated Aug. 26, 2021.
Written Opinion of the International Search Authority in the international application No. PCT/CN2021/099159, dated Sep. 8, 2021.
Written Opinion of the International Search Authority in the international application No. PCT/CN2021/099149, dated Sep. 7, 2021.
First Office Action of the U.S. Appl. No. 17/464,886, dated Feb. 21, 2023.
First Office Action of the U.S. Appl. No. 17/462,042, dated Mar. 2, 2023.
Written Opinion of the International Search Authority in the international application No. PCT/CN2021/099146, dated Sep. 7, 2021.
Written Opinion of the International Search Authority in the international application No. PCT/CN2021/099173, dated Aug. 26, 2021.
International Search Report in the international application No. PCT/CN2021/109442, dated Jan. 4, 2022.
Notice of Allowance of the Chinese application No. 202110352509.2, dated Apr. 15, 2022.
International Search Report in the international application No. PCT/CN2021/109515, dated Dec. 30, 2021.
Notice of Allowance of the Chinese application No. 202110352499.2, dated Apr. 15, 2022.
First Office Action of the U.S. Appl. No. 17/515,776, dated Mar. 3, 2023.
International Search Report in the international application No. PCT/CN2021/109464, dated Dec. 30, 2021.
Notice of Allowance of the Chinese application No. 202110327478.5, dated Apr. 25, 2022.
Kristofik Stefan et al: "Enhancement of fault collection for embedded RAM redundancy analysis considering intersection and orphan faults", Integration, the VLSI Journal, North-Holland Publishing Company. Amsterdam, NL, vol. 62, Mar. 13, 2018 (Mar. 13, 2018), pp. 190-204, XP085401084.
Wey C-L et al: "On the Repair of Redundant RAM's", IEEE Transactions on Computer-Aided Design of Integrated Circuits and Systems, IEEE, USA, vol. CAD-06, No. 2, Mar. 1, 1987 (Mar. 1, 1987), pp. 222-231, XP000097484.
First Office Action of the European application No. 21773439.1, dated Feb. 24, 2023.
Non-Final Office Action of the U.S. Appl. No. 17/446,978, dated Aug. 21, 2023, 51 pages.
Non-Final Office Action of the U.S. Appl. No. 17/648,665, dated Aug. 28, 2023, 67 pages.

(56) References Cited

OTHER PUBLICATIONS

Notice of Allowance of the U.S. Appl. No. 17/568,948, dated Aug. 30, 2023, 60 pages.

* cited by examiner

FAIL BIT REPAIR METHOD AND DEVICE

CROSS-REFERENCE TO RELATED APPLICATIONS

This is a continuation of International Patent Application No. PCT/CN2021/099173, filed on Jun. 9, 2021, which claims priority to Chinese Patent Application No. 202010832381.5, filed on Aug. 18, 2020. The disclosures of these applications are hereby incorporated by reference in their entirety.

BACKGROUND

With the rapid development of computer technologies, integrated circuit chip has played an increasingly important role in people's production and life. However, failure problems are inevitable during development, production, and use of chips, and redundant circuits may usually be adopted for repair processing of FBs in the chips.

SUMMARY

This disclosure relates generally to the technical field of integrated circuits, and more specifically to a Fail Bit (FB) repair method and device.

According to an aspect of the disclosure, a virtual object processing method is provided, which may include: a bank to be repaired of a chip to be repaired is determined, the bank to be repaired including multiple target repair banks; first repair processing is performed on a first FB in each target repair bank using a redundant circuit; after first repair processing is performed, second FB position determination is performed to determine a bit position of a second FB in each target repair bank, and second repair processing is performed on the second FB according to the bit position of the second FB; an unrepaired FB in each target repair bank is determined, and candidate repair combinations of the unrepaired FBs and a candidate combination count of the candidate repair combinations are determined; and a combination count threshold is acquired, and if the candidate combination count is greater than the combination count threshold, a target repair position is determined, and repair processing is performed on the target repair position using a Redundant Word-Line (RWL), the target repair position being a position of an FB that maximally reduces the candidate combination count after repair processing.

The disclosure also discloses an FB repair device, which may include: a bank determination module, configured to determine a bank to be repaired of a chip to be repaired, the bank to be repaired including multiple target repair banks; a first repair processing module, configured to perform first repair processing on a first FB in each target repair bank using a redundant circuit; a second repair processing module, configured to, after first repair processing is performed, perform second FB position determination to determine a bit position of a second FB in each target repair bank, and perform second repair processing on the second FB according to the bit position of the second FB; a repair combination determination module, configured to determine an unrepaired FB in each target repair bank, and determine candidate repair combinations of the unrepaired FBs and a candidate combination count of the candidate repair combinations; and a third repair processing module, configured to acquire a combination count threshold, and if the candidate combination count is greater than the combination count threshold, determine a target repair position and perform repair processing on the target repair position using an RWL, the target repair position being a position of an FB that maximally reduces the candidate combination count after repair processing.

It is to be understood that the above general description and the following detailed description are only exemplary and explanatory and not intended to limit the disclosure.

BRIEF DESCRIPTION OF THE DRAWINGS

The accompanying drawings, which are incorporated in and constitute a part of this specification, illustrate embodiments consistent with the application and, together with the specification, serve to explain the principle of the disclosure. It is apparent that the drawings in the following descriptions are only some embodiments of the application, and those of ordinary skill in the art may also obtain other drawings according to these drawings without creative efforts. In the drawings.

DETAILED DESCRIPTION

In order to make the objectives, features, and advantages of the disclosure clearer and easier to understand, the disclosure will further be described below in detail in combination with the drawings and specific implementation modes.

If presently available redundant circuits include more than one allocation that may really repair all FBs, it is considered that there is a true solution to redundant-circuit-based BF repair. When there is a true solution, at least one allocation solution may definitely be found. This is an optimal allocation method. A present redundant circuit allocation method is non-optimal.

Failure problems are inevitable during development, production, and use of chips, and redundant circuits may usually be adopted for repair processing of FBs in the chips. However, a present redundant circuit allocation method is non-optimal. For example, a Dynamic Random-Access Memory (DRAM) can be divided into a cell region and a periphery region. The cell region includes many storage cells, so the storage cells can be divided into banks.

Redundant circuits can be divided into two types of orthogonal straight lines, i.e., Redundant Bit-Lines (RBLs) and RWLs. Repair ranges when redundant circuits repairs FBs are half-banks, and are limited in quantity. Multiple banks are divided in a chip, and if not all FBs in a half-bank of only one repair range repaired successfully, the chip is scrapped. At present, a common allocation method includes preferentially allocating RBLs for repair, and allocating RWLs for repair when there are not enough RBLs. When the existing allocation method is adopted, if there is a true solution, the allocation result usually does not repair all FBs successfully, resulting in scrapping of the whole chip and greatly reducing the yield.

In an optimal repair process of a chip to be repaired, when redundant circuits are allocated to repair many FBs, there can be such a problem that a repair combination count for repairing the FBs is too large. The combination count being too large may refer to that an operational combination count is greater than a supported combination count. The operational combination count, also called a candidate combination count, may refer to the number of all possible allocated repair combinations. All the possible allocated repair combinations are required to be acquired in the optimal repair processing process to find an allocated repair combination corresponding to a minimum cost. The supported combination count, also called a combination count threshold, may refer to a combination count threshold set in consideration of two factors of an operational capability of a platform and effective time of a production line. In general, when the operational combination count is greater than the supported combination count, it may be considered that no optimal repair combination for FBs can be found, and thus it is determined that the chip to be repaired may not be repaired successfully.

Figure 1:
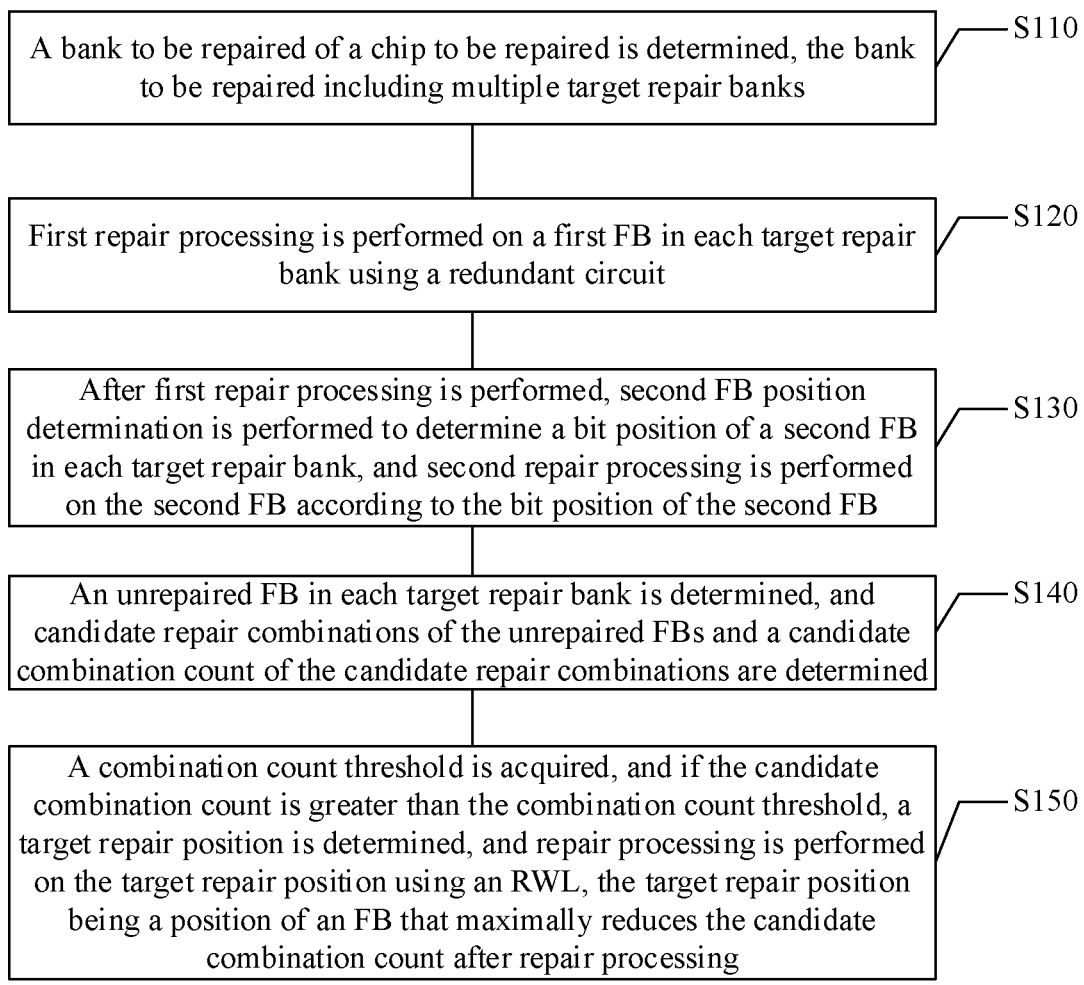
FIG. 1 schematically shows a flowchart of an FB repair method according to an exemplary implementation mode of the disclosure.

Based on this, there is provided in an exemplary embodiment an FB repair method at first. FIG. 1 schematically shows a flowchart of an FB repair method according to some embodiments of the disclosure. Referring to FIG. 1, the FB repair method may include the following operations.

In S110, a bank to be repaired of a chip to be repaired is determined, including multiple target repair banks.

In some embodiments of the disclosure, the chip to be repaired can be a chip with FBs in a cell region. The bank to be repaired can be a bank with FBs in a storage cell. The repair range of the bank to be repaired may usually be a half-bank. The target repair bank can be multiple banks formed after the bank to be repaired is divided. A bank to be repaired can be divided into multiple target repair banks.

When an optimal allocation method of redundant circuits for a certain repair range in the chip is determined, the chip to be repaired can be acquired at first, and a bank to be repaired of the chip to be repaired is determined for repair processing using a redundant circuit.

Figure 2:
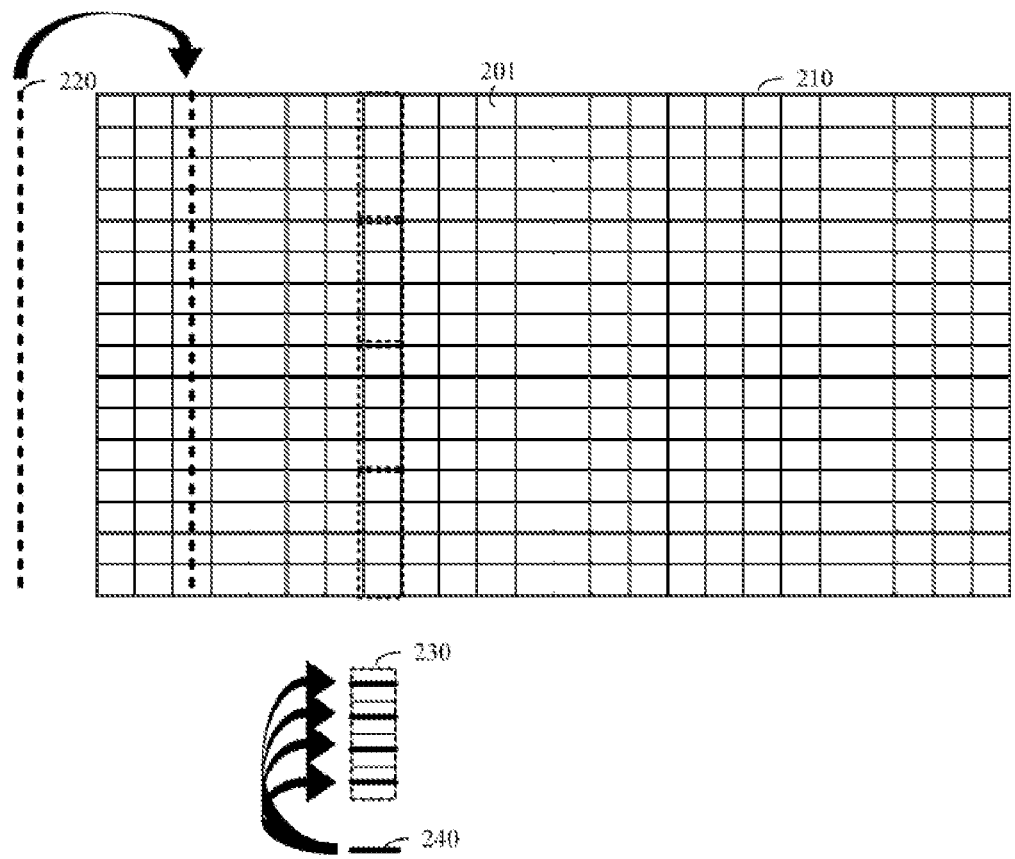
FIG. 2 schematically shows a line diagram of an initial bank to be repaired half-bank according to an exemplary implementation mode of the disclosure.

References are made to FIG. 2, which schematically shows a line diagram of an initial bank to be repaired half-bank according to an exemplary implementation mode of the disclosure. In FIG. 2, taking an initial bank to be repaired half-bank as an example, the initial bank to be repaired 210 may include multiple Data Queues (DQs) 201. Specifically, vertical and horizontal lines in the half-bank (210) can be represented by Word Lines (WLs) and Bit Lines (BLs) respectively. For example, a length of the WL can be continuous bits of 16 vertical continuous DQs, and a length of the BL can be continuous bits of one horizontal DQ. Rules for allocating redundant circuits to repair FBs are as follows. For RWLs 220, a repair range 210, i.e., a half-bank, includes $N_{RWL}$ RWLs, one RWL can be allocated to repair any WL in the half-bank, and a width of an RWL can be $w^{RWL}$ bits. For RBLs 240, vertical 4-DQ can be determined as a repair range 230, namely four continuous DQs can be determined as a repair range, every 4-DQ includes $N_{RBL}$ RBLs, and allocating the RBLs to repair BLs satisfies an appositional repair rule, namely one RBL can be allocated to repair any BL in the corresponding 4-DQ, BLs at the same positions in other DQs may also be repaired together, and allocated repair over non-corresponding 4-DQs is not allowed. A width of an RBL can be $w^{RBL}$ bits.

It is to be noted that specific numerical values of $N_{RWL}$, $N_{RBL}$, $w^{RWL}$, and $w^{RBL}$ in the disclosure are determined according to a product feature of the chip, and no special limits are made thereto in the disclosure.

According to some embodiments of the disclosure, an initial bank to be repaired of the chip to be repaired is determined, the initial bank to be repaired including an initial WL and an initial BL. AWL compression ratio and BL compression ratio of the initial bank to be repaired are acquired. Compression processing is performed on the initial WL according to the WL compression ratio, and compression processing is performed on the initial BL according to the BL compression ratio, to form the bank to be repaired. The initial bank to be repaired can be a repair bank determined when repair processing is performed on the chip to be repaired. The initial WL can be a WL circuit in the initial bank to be repaired. The initial BL can be a BL circuit in the initial bank to be repaired. The WL compression ratio can be a compression ratio adopted for performing compression processing on the initial WL in the initial bank to be repaired. The BL compression ratio can be a compression ratio adopted for performing compression processing on the initial BL in the initial bank to be repaired. The bank to be repaired can be a repair bank formed after compression processing is performed on the initial bank to be repaired.

Figure 3:
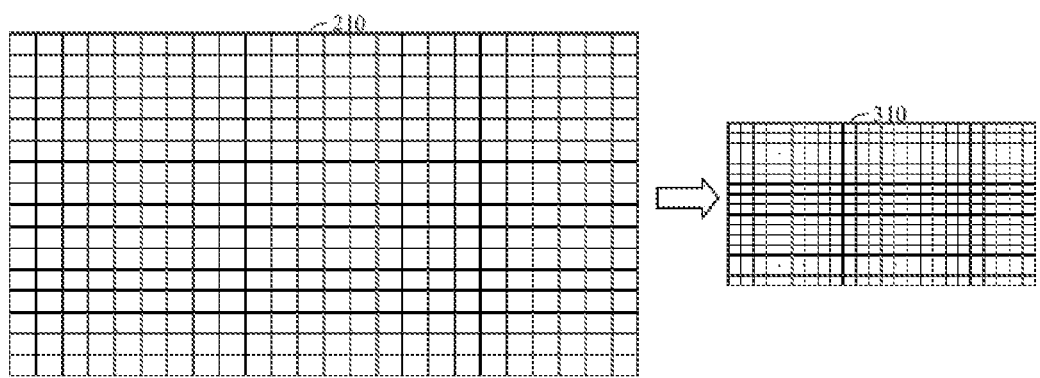
FIG. 3 schematically shows a change chart of performing compression processing on an initial bank to be repaired to form a bank to be repaired according to an exemplary implementation mode of the disclosure.

Before repair processing is performed on the chip to be repaired, to weaken the factor of the widths of the RWL and the RBL to make it unnecessary to consider the width of the redundant circuit during subsequent processing, in S301, compression processing can be performed on the initial bank to be repaired to form the bank to be repaired for a repair processing process. References are made to FIG. 3, which schematically shows a change chart of performing compression processing on an initial bank to be repaired to form a bank to be repaired according to an exemplary implementation mode of the disclosure. For example, the WL compression ratio and the BL compression ratio can be configured as $w^{RWL}$ and $w^{RBL}$ respectively. In FIG. 3, compression processing is performed on the initial WL and initial BL in the initial bank to be repaired 210 according to the WL compression ratio $w^{RWL}$ and the BL compression ratio $w^{RBL}$ respectively. When compression processing is performed, an OR operation can be performed. A value of an FB can be 1, and a value of a non-FB can be 0. After compression processing is performed on the initial bank to be repaired 210, the bank to be repaired 310 can be formed, and the bank to be repaired is recorded as U. Performing the abovementioned compression processing process on the initial bank to be repaired to form the bank to be repaired may greatly reduce the number of bits in the original half-bank, reduce the processing time, and improve the processing efficiency.

According to some embodiments of the disclosure, a division column of the bank to be repaired is determined, a width of the division column being determined according to the number of row-direction equivalent bits in a DQ after compression processing. Column division processing is performed on the bank to be repaired according to the division column to form the multiple target repair banks. The division column can be a basic division unit adopted when division processing is performed on the initial bank to be repaired. The row-direction equivalent bits can be bits in each row in the DQ in the bank to be repaired formed after compression processing is performed on the initial bank to be repaired.

Figure 4:
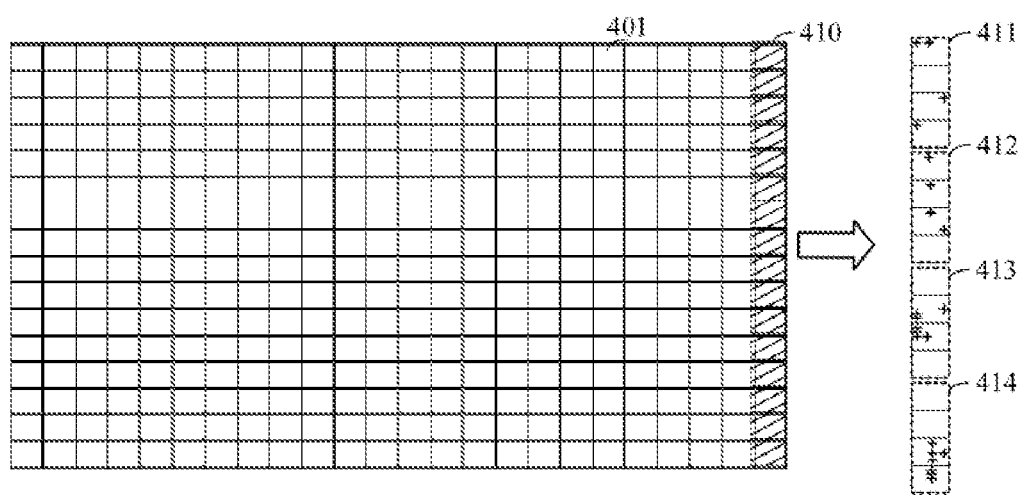
FIG. 4 schematically shows an FB map of a target repair bank according to an exemplary implementation mode of the disclosure.

References are made to FIG. 4, which schematically shows an FB map of a target repair bank according to an exemplary implementation mode of the disclosure. In FIG. 4, the bank to be repaired 410 may include multiple DQs 401. For example, in the disclosure, the division column of the bank to be repaired can be determined according to the width of the row-direction equivalent bits in the DQ. For example, a width of a vertical DQ 401 can be determined as the width of the division column, and all vertical DQs can be divided into a target repair bank. After the bank to be repaired is divided according to the division column, the target repair bank can be a bank formed by a row-direction DQ and all the vertical DQs. When column division processing is performed on the bank to be repaired according to the width of a row-direction equivalent bit, the bank to be repaired can be divided into the multiple target repair banks 410 to perform repair processing based on the target repair banks, such that the complexity of performing repair processing on the FBs using the redundant circuit can be reduced.

In S120, first repair processing is performed on a first FB in each target repair bank using a redundant circuit.

In some exemplary implementation modes of the disclosure, the redundant circuit may include an RWL and an RBL. First repair processing can be a process of performing repair processing on the FB using the RWL and the RBL after the FB in the target repair bank is determined. First repair processing, also called Must Repair (MR), may represent a repair process that one of the RBL or the RWL must be used for repair and cannot be replaced with the other.

Referring to FIG. 4, repair processing can be performed on the target repair banks one by one. For example, banks to be processed 410, i.e., banks $A_r$, r=1, 2, ..., n, can be sequentially selected from right to left, n being the number of the target repair banks, and repair processing is performed on the target repair banks $A_r$ one by one. FB can be adopted to represent a fail bit in the target repair bank, namely a value thereof is 1, and non-FB can be adopted to represent a not fail bit in the target repair bank, namely a value thereof is 0.

According to some embodiments of the disclosure, an FB feature map of the target repair bank is determined. First repair processing is performed on an FB in each target repair bank using an RWL and/or an RBL according to the FB feature map. The FB feature map can be a feature map obtained after abstract extraction is performed on the FB in the target repair bank.

After the multiple target repair banks are generated, one target repair bank can be selected, and an FB feature map of the target repair bank can be generated. First repair processing is performed on the FB in the target repair bank using the RWL and/or the RBL according to the FB feature map.

According to some embodiments of the disclosure, the target repair bank is divided into multiple basic repair banks, a basic repair bank including a preset number of DQs. The basic repair banks are acquired, and bit states of all bits in the basic repair banks are determined. OR operation processing is performed on the bit states in every preset number of DQs, and FB maps of the basic repair banks are generated by merging. The FB feature map is generated according to the FB map corresponding to each basic repair bank. The basic repair bank can be a repair bank formed after bank division processing is performed on the target repair bank. The basic repair bank may include a preset number of DQs, and the preset number can be set according to a division requirement. For example, the preset number can be configured to 2, 4, and 8. No special limits are made thereto in the disclosure. The bit state may represent that each bit in the basic repair bank is in a valid state or an invalid state. The FB map can be a feature map corresponding to each FB in the basic repair bank.

When an RBL is adopted for repair processing, the appositional repair rule is satisfied, namely one RBL can be allocated to repair any BL in the corresponding 4-DQ. Therefore, the preset number can be configured to 4, and four DQs are determined as a basic repair bank. For example, every four DQs can be determined as a basic repair bank, and $B_{ri}$ can be adopted to represent the basic repair bank, namely i-th 4-DQ in $A_r$. When a target repair bank is determined, the target repair bank can be divided into multiple basic repair banks, and bit states of all bits in each basic repair bank are determined one by one. Referring to FIG. 4, "+" can be adopted to represent the FB in the basic repair bank. After the target repair bank 410 is divided, four basic repair banks are obtained, i.e., basic repair bank 411, basic repair bank 412, basic repair bank 413, and basic repair bank 414.

Figure 5:
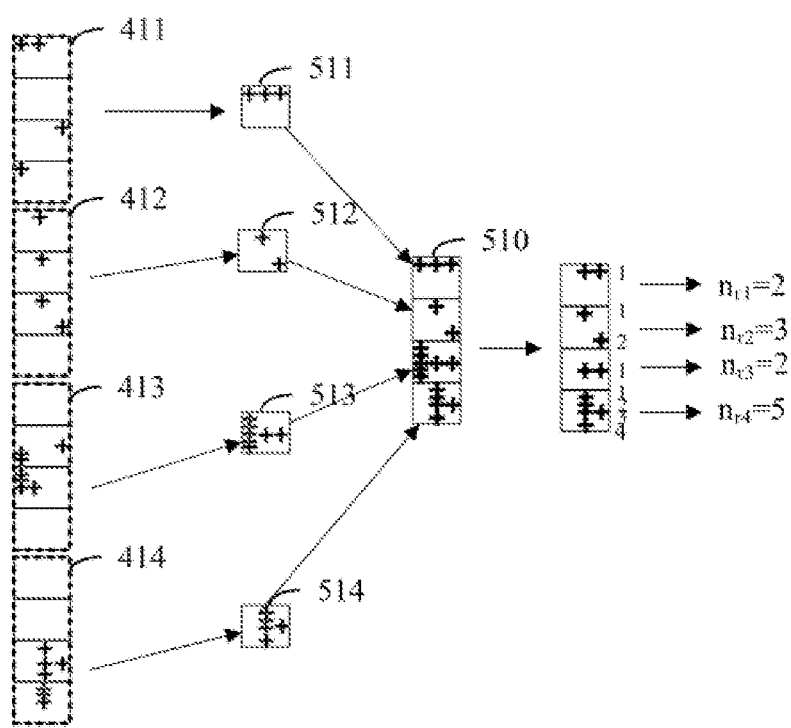
FIG. 5 schematically shows an FB feature map of a generated target repair bank according to an exemplary implementation mode of the disclosure.

When the bit states in each basic repair bank are determined, OR operation processing can be performed on the bit states in a basic repair bank, including 0 or 0=0, 0 or 1=1, 1 or 0=1, and 1 or 1=1. For $\forall B_{ri} \in A_r$, the OR operation can be performed on each DQ in $B_{ri}$ to obtain an FB map, recorded as $M_{ri}$ and representing an i-th feature map, until such processing is performed on all $B_{ri}$ in $A_r$. References are made to FIG. 5. FIG. 5 schematically shows a generated FB feature map of a target repair bank according to an exemplary implementation mode of the disclosure. OR operation processing can be performed on FBs in basic repair bank 411 to basic repair bank 414 respectively to obtain corresponding FB maps, i.e., FB map 511, FB map 512, FB map 513, and FB map 514 respectively. An FB feature map 510 corresponding to the target repair bank can be generated according to the FB map of each basic repair bank.

According to some embodiments of the disclosure, determining is performed: whether the FB feature map satisfies a preset condition is determined, the preset condition including a first preset condition and a second preset condition. First initial repair processing is performed: if the FB feature map satisfies the first preset condition, repair processing is performed on the FB using the RWL, the first preset condition including that an FB count of a first numbered WL in the basic repair bank is greater than a present left RBL count of the basic repair bank. Second initial repair processing is performed: if the FB feature map satisfies the second preset condition, repair processing is performed on the FB using the RBL, the second preset condition including that an FB count of a first numbered BL in the basic repair bank is greater than a present left RWL count of the basic repair bank.

The preset condition can be a condition for determining the redundant circuit to be adopted to repair the target repair bank according to the FB feature map corresponding to the target repair bank. When repair processing is performed on the FB, two redundant circuits, i.e., the RWL and the RBL, can be adopted for repair processing. The first preset condition, i.e., phenomenon 1, can be a corresponding preset condition when the RWL is adopted to perform repair processing on the FB. The second preset condition, i.e., phenomenon 2, can be a corresponding preset condition when the RBL is adopted to perform repair processing on the FB. The FB count of the first numbered WL can be the number of FBs in a jth WL in $M_{ri}$, recorded as $N_{ij}^{FWL}$. The present left RBL count of the basic repair bank can be the number of present available RBLs in $M_{ri}$ recorded as $N_{ri}^{RBL}$. The FB count of the first numbered BL can be the number of FBs in a jth BL in $M_{ri}$, recorded as $N_{ij}^{FBLs}$. The present left RWL count can be the number of present left available RWLs, recorded as $N_{RWL}^{(t)}$.

Figure 6:
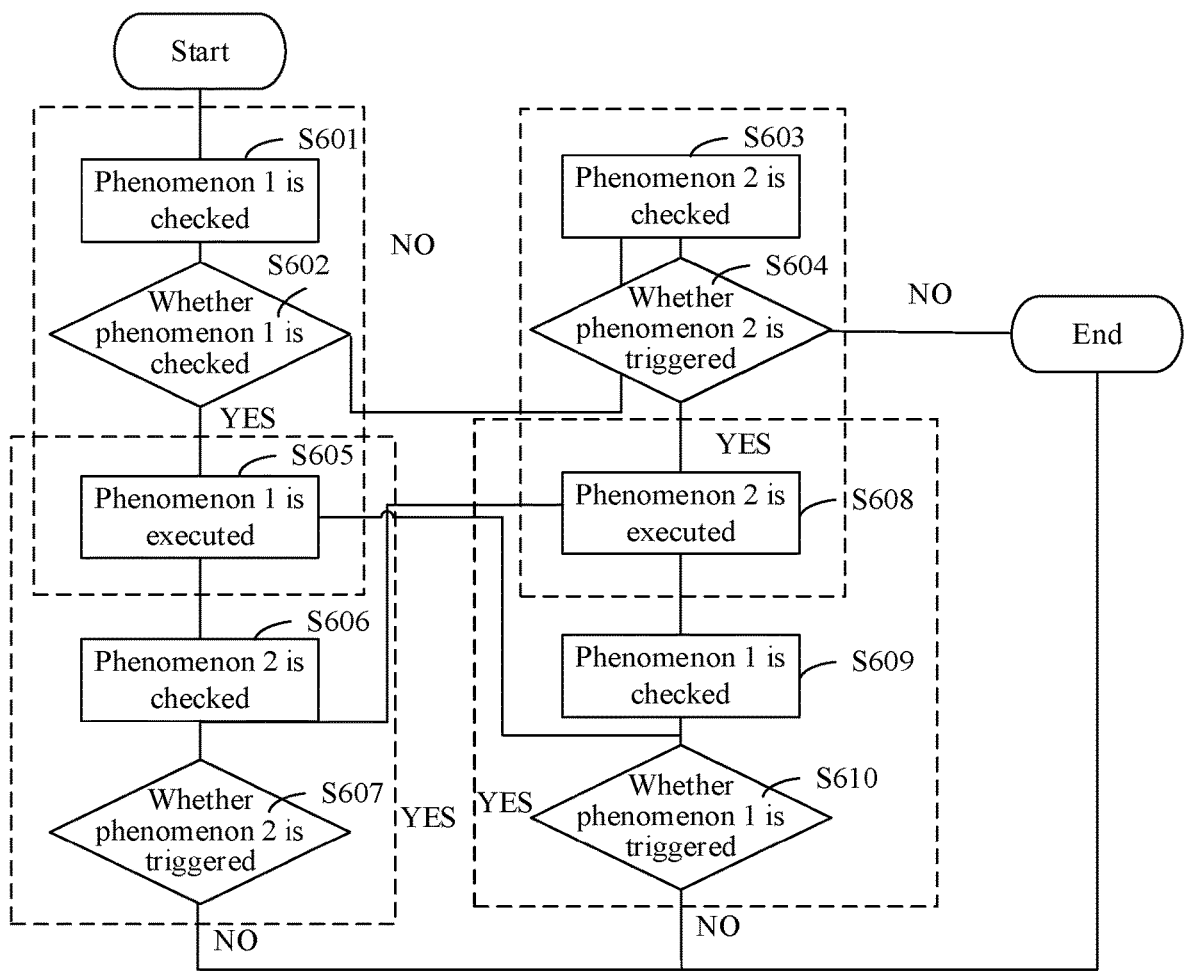
FIG. 6 schematically shows a flowchart of first repair processing according to an exemplary implementation mode of the disclosure.

When the FB feature map of the target repair bank is obtained, first repair processing can be performed on the FB in the target repair bank using the RWL and/or the RBL, namely Force Repair (FR) processing is performed. Referring to FIG. 6, which is a flowchart of first repair processing according to an exemplary implementation mode of the disclosure, the following operations are specifically executed.

In S601 to S602, whether the determined FB feature map satisfies the first preset condition is determined. If the FB feature map does not satisfy the first preset condition, namely phenomenon 1 is not triggered, S603 to S604 are executed, and whether phenomenon 2 is triggered is determined. If it is determined that the FB feature map satisfies the first preset condition, namely phenomenon 1 is triggered, S605 is executed, namely WL repair processing is performed on the target repair bank. Specifically, the first preset condition can be that the FB count of the first numbered WL in the basic repair bank is greater than the present left RBL count of the basic repair bank. For each basic repair bank in the target repair bank, namely $N_{ij}^{FWL} \in \forall M_{ri}$, when $N_{ij}^{FWL} > N_{ri}^{FBL}$, the WL at corresponding position j is repaired using the RWL. When WL repair is performed using the RWL, the present left RWL count correspondingly decreases, so the present left RWL count can be correspondingly updated when WL repair is performed, namely $N_{RWL}^{(t+1)} = N_{RWL}^{(t)} - n_{RWL}^{(t)}$, where $N_{RWL}^{(t)}$ represents the number of the left available RWLs, t represents a present variable, t+1 represents a next variable, and $n_{RWL}^{(t)}$ may represent the number of RWLs that have been used in the target repair bank. If $N_{RWL}^{(t+1)} < 0$, it indicates that there is no available RWL, and no RWL can be adopted for WL repair processing. In S606, whether the FB feature map satisfies the second preset condition can be continued to be determined.

In S607, if the FB feature map satisfies the second preset condition, namely phenomenon 2 is triggered, S608 is executed, namely BL repair processing is performed on the target repair bank. Specifically, the second preset condition can be that the FB count of the first numbered BL in the basic repair bank is greater than the present left RWL count of the basic repair bank. For each basic repair bank in the target repair bank, namely $N_{ij}^{FBLs} \in \forall M_{ri}$, when $N_{ij}^{FBLs} > N_{RWL}^{(t)}$, the WL at corresponding position j is repaired using the RBL. When WL repair is performed using the RBL, the present left RBL count correspondingly decreases, so the present left RBL count can be correspondingly updated when WL repair is performed, namely $N_{RWL}^{(t+1)} = N_{RWL}^{(t)} - N_{RWL}^{(t)}$, where $N_{RWL}^{(t)}$ represents the number of the left available RWLs, t represents the present variable, t+1 represents the next variable, and $n_{RWL}^{(t)}$ may represent the number of the RWLs that have been used in the target repair bank. If $N_{RWL}^{(t+1)} < 0$, it indicates that there is no available RWL, and no RWL can be adopted for WL repair processing. whether the FB feature map satisfies the second preset condition can be continued to be determined. $N_{RBL}^{(t+1)} = N_{RBL}^{(t)} - N_{RBL}^{(t)}$, where $N_{RBL}^{(t)}$ represents the number of the left available RWLs, t represents the present variable, t+1 represents the next variable, and $n_{RBL}^{(t)}$ may represent the number of RBLs that have been used in the target repair bank. If $N_{RBL}^{(t+1)} < 0$, it indicates that there is no available RBL, and no RBL can be adopted for WL repair processing. In such case, in S609, whether the FB feature map satisfies the first preset condition can be continued to be cyclically determined, and if the FB feature map satisfies the first preset condition, namely phenomenon 1 is triggered, S610 is executed. Whether the FB feature map satisfies the first preset condition and the second preset condition is cyclically determined to perform repair processing on the FB in the target repair bank.

It is to be noted that some chips to be repaired have been repaired after first repair processing, i.e., FR processing, and thus do not need subsequent operations, and for chips that are not completely repaired after first repair processing, repair operations after initial repair processing are required to be continued. For a chip that is not completely repaired after first repair processing, the following processing operations can be continued to be executed.

In S130, after first repair processing is performed, second FB position determination is performed to determine a bit position of a second FB in each target repair bank, and second repair processing is performed on the second FB according to the bit position of the second FB.

In some embodiments of the disclosure, the second FB can be an FB that is not repaired after first repair processing and satisfies some preset state conditions. Second FB position determination can be a step of determining the bit position of the second FB in each target repair bank in the chip to be repaired. The bit position of the second FB can be a position of the second FB in the target repair bank. Second repair processing, also called optimal MR, can be a process that positions of some FBs can be directly ruled to be repaired using the RBL or the RWL when some state conditions are satisfied, and this repair solution is definitely optimal.

Figure 7:
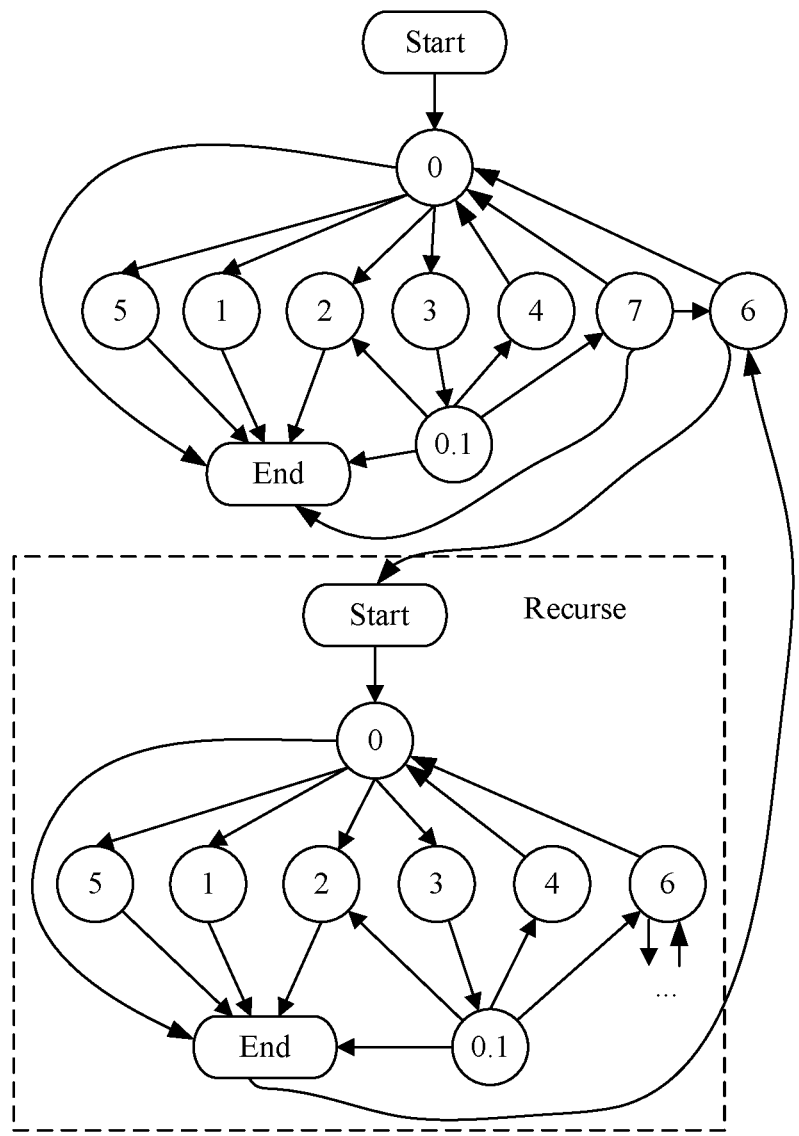
FIG. 7 schematically shows a state diagram of State Ruling Repair (SRR) processing according to an exemplary implementation mode of the disclosure.

References are made to FIG. 7, which schematically shows a state diagram of SRR processing according to an exemplary implementation mode of the disclosure. In FIG.

7, a state that a bank feature map corresponding to the target repair bank is consistent with can be ruled to perform corresponding second repair processing on the FB in the target repair bank. For example, a state set of bank feature map states may include multiple different ruled states such as 0, 0.1, 1, 2, 3, 4, 5, and 6.

According to some embodiments of the disclosure, the FB feature map of the target repair bank is acquired, and a target FB count, available RBL count, and present left RWL count of the target repair bank are determined. If the target repair bank satisfies an initial determination condition, a repair processing operation for the chip to be repaired is ended, the initial determination condition including that the target FB count is equal to 0, or the available RBL count is equal to 0, or the present left RWL count is less than 0. If the target repair bank does not satisfy the initial determination condition, segmentation processing is performed on the FB feature map according to an association relationship to generate a segmented feature map group, the segmented feature map group including a segmented feature map. If a bank feature map state of the target repair bank is a second initial state and a new FB feature map is generated in the segmented feature map group, the second initial state is adjusted to a first initial state.

A target repair bank $A_r$ may include one or more feature map groups, and the kth map group in $A_r$ can be represented by $G_{rk}$. Herein, a presently processed feature map group, i.e., a present feature map group, can be represented by $G_c$. A vector formed by an FB count of all WBs in the present feature map group in the target repair bank can be represented by $n_c^{FWL}$, and $n_{c+k}^{FWL}$ may represent a vector formed by an FB count of all WLs in the next k feature map groups in the target repair bank. The available RBL count can be the number of all RBLs in the present feature map group $G_c$, and can be represented by $N_{rc}^{TRBL}$, namely $$\sum_{M_{ri} \in G_c} N_{ri}^{RBL}.$$

Associated feature maps may refer to that, if there are unrepaired FBs at the same WL position in any two feature maps, it may be considered that the two feature maps are associated, otherwise they are unassociated. A spuriously associated feature map may refer to any associated map of which an RBL count is greater than an FBL count, namely the RBL count>=the FBL count. FBL may represent a bit including an FB. Segmentation processing can be a process of, for each map in the map group, independently forming a new map group by associated maps and independently forming a new map group by any associated or spuriously associated maps. The target FB count can be the number of all FBs in the present feature map group, and can be represented by $N_{rc}^{FB}$. The number of the FBL under operation processing can be represented by $n^{FBL}$. An index value of an FB of a certain BL in the feature map can be represented by $y_l^{FBL}$. The segmented feature map group can be a new feature map group generated after segmentation processing is performed on the FB feature map. The segmented feature map can be a feature map in the segmented feature map group, and a segmented feature map group may include one or more segmented feature maps. The bank feature map state can be a state corresponding to the FB feature map corresponding to the target repair bank.

After first repair processing, the FB feature map corresponding to each target repair bank subjected to first repair processing can be obtained, and the following processing is performed on each target repair bank. A target FB count $N_{rc}^{FB}$, available RBL count $N_{rc}^{TRBL}$, and present left RWL count $N_{RWL}^{(t)}$ corresponding to a target repair bank are acquired. If the target repair bank satisfies the initial determination condition, the repair processing operation for the chip to be repaired is ended. The initial determination condition can be that the target FB count $N_{rc}^{FB}$ is equal to 0, the available RBL count $N_{rc}^{TRBL}$ is equal to 0, or the present left RWL count $N_{RWL}^{(t)}$ is less than 0.

If the target repair bank does not satisfy the initial determination condition, segmentation processing is performed on the FB feature map according to the association relationship to generate the segmented feature map group, namely each map group in the target repair bank is segmented according to the defined association relationship. If the bank feature map state of the target repair bank is the first initial state before segmentation processing, and a new segmented feature map group is generated after segmentation processing, the bank feature map state of the target repair bank is adjusted from the second initial state to the first initial state. In the disclosure, the first initial state can be defined as a state corresponding to numerical value 0, and the second initial state can be defined as a state corresponding to numerical value 0.1. After segmentation processing is completed, the bank feature map state may further be determined. When the bank feature map state is the first initial state, whether the map of each group is consistent with specific states corresponding to numerical values 1, 2, 3, and 5 can be checked. If the bank feature map state is the second initial state, whether the map of each group is consistent with specific states corresponding to numerical values 2 and 4 can be checked. In addition, if state 6 exists, whether the map is consistent with the state corresponding to numerical value 6 is required to be checked. A corresponding repair operation is executed according to the state ruled according to each bank feature map state, and if there is no state consistent with the bank feature map state, the repair processing operation for the chip to be repaired is ended.

Figure 8:
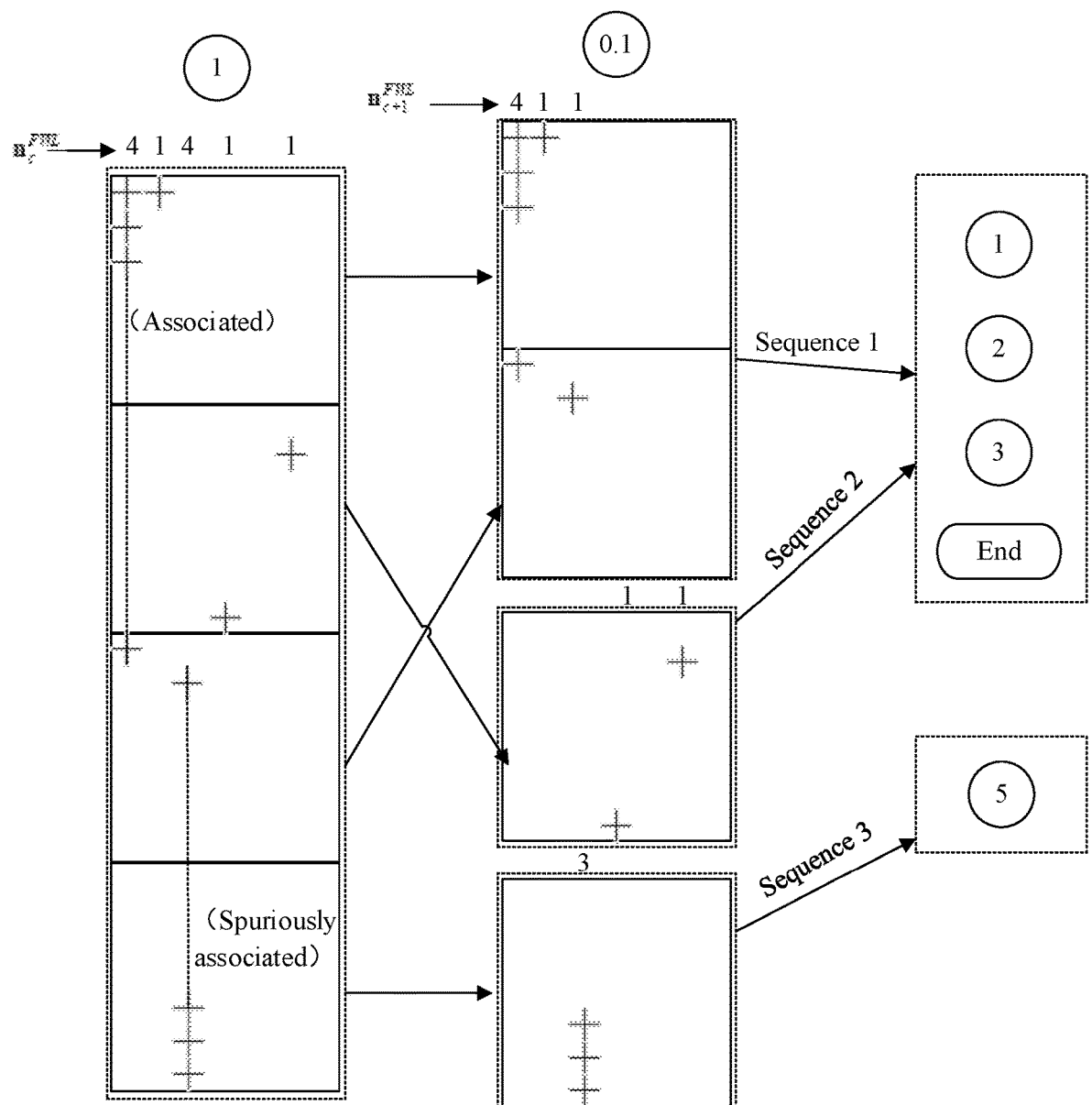
FIG. 8 schematically shows a process chart of performing segmentation processing on a feature map group according to an exemplary implementation mode of the disclosure.

References are made to FIG. 8, which schematically shows a process chart of performing segmentation processing on a feature map group according to an exemplary implementation mode of the disclosure. When corresponding segmentation processing is performed on a bank feature map that satisfies state=0.1, whether the state of the bank feature map can be switched to state=0 can be determined, a ruled state that the bank feature map is consistent with is further ruled according to an initial state corresponding to the bank feature map state, and second repair processing is performed on the target repair bank according to the specific ruled state. A specific processing process is as follows.

According to some embodiments of the disclosure, if the bank feature map state is the first initial state, whether the bank feature map state is consistent with the first ruled state in a first state set is determined, the first ruled state including that the available RBL count is greater than a first preset numerical value and a maximum WL FB count is equal to the first preset numerical value. If the bank feature map state is consistent with the first ruled state, second repair processing in the first ruled state is performed. Second repair processing in the first ruled state includes: SRR1: a first maximum bit position corresponding to a first BL maximum FB in the segmented feature map is acquired, and first initial repair processing is triggered to be performed to repair the FB at the first maximum bit position; and determining in the first ruled state: whether the segmented feature map subjected to SRR1 satisfies a first determination condition is determined, the first determination condition including that the target FB count is greater than 0, the available RBL count is greater than 0, and a next left RWL count is more than or equal to 0, and if the segmented feature map subjected to SRR1 satisfies the first determination condition, SRR1 is performed.

The first preset numerical value can be a preset first numerical value. For example, the first preset numerical value can be 1. The first state set can be a set formed by states for comparison with the bank feature map state when the bank feature map state is the first initial state. The first ruled state can be a predefined ruled state. For example, the first ruled state can be a state corresponding to state=1. A vector formed by an FB count of all BLs in the present feature map group can be represented by $n_c^{FBL}$. A vector formed by an FB count of all WLs in the present feature map group can be represented by $n_c^{FWL}$. The maximum WL FB count can be a maximum value in $n_c^{FBL}$, and can be represented by $\max(n_c^{FWL})$. The first ruled state can be that the available RBL count is greater than the first preset numerical value and the maximum WL FB count is equal to the first preset numerical value, namely $N_{rc}^{TRBL}>1$ and $\max(n_c^{FWL})=1$. Second repair processing in the first ruled state can be a repair step for the target repair bank when the bank feature map state is consistent with the first ruled state. The first BL maximum FB can be a maximum value of an FB BL position number in $n_c^{FWL}$, and can be represented by $Y_c^{Max}$, where $Y_c^{Max}$ is $\arg\max f(y_i)=(n_{c,y_i}^{FBL}|n_c, y_i^{FBL} \in n_c^{FBL})$. The first maximum bit position is a position corresponding to $Y_c^{Max}$.

Figure 9:
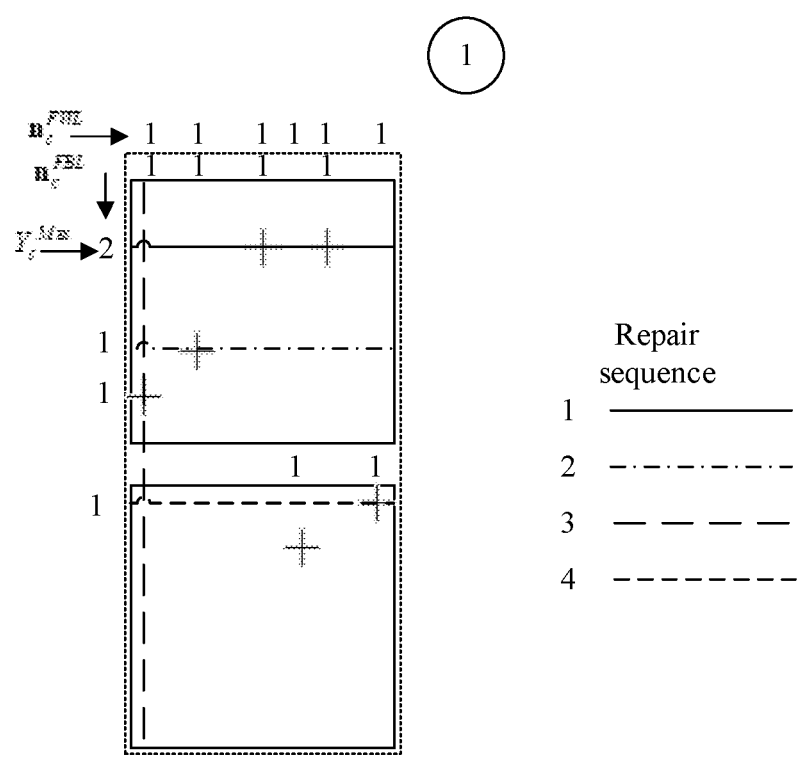
FIG. 9 schematically shows an FB feature map consistent with a first ruled state according to an exemplary implementation mode of the disclosure.

References are made to FIG. 9, which schematically shows an FB feature map consistent with a first ruled state according to an exemplary implementation mode of the disclosure. The FB feature map in FIG. 9 is consistent with the first ruled state. FIG. 9 shows a repair sequence when repair processing is performed on FBs. If the bank feature map state is consistent with the first ruled state, second repair processing in the first ruled state is performed, including SSR1 and determining in the first ruled state. The following operations are specifically executed. In 1, the first maximum bit position in the segmented feature map is acquired. In 2, first initial repair processing is triggered to be performed to repair the FB at the first maximum bit position. In 3, whether the segmented feature map subjected to SSR1 satisfies the first determination condition is determined. The first determination condition can be that the target FB count is greater than 0, the available RBL count is greater than 0, and the next left RWL count is more than or equal to 0, namely $N_{rc}^{FB}$, $N_{rc}^{TRBL}$, and $N_{RWL}^{(t+1)} \geq 0$. When the segmented feature map satisfies the first determination condition, 1 is continued to be executed, otherwise the state is terminated.

According to some embodiments of the disclosure, if the bank feature map state is the first initial state, whether the bank feature map state is consistent with a second ruled state in the first state set is determined, and the second ruled state including that the available RBL count is equal to the first preset numerical value. If the bank feature map state is consistent with the second ruled state, second repair processing in the second ruled state is performed. Second repair processing in the second ruled state includes that: the first maximum bit position corresponding to the first BL maximum FB in the segmented feature map is acquired, and first initial repair processing is triggered to be performed to repair the FB at the first maximum bit position. The second ruled state can be a predefined ruled state. For example, the second ruled state can be a state corresponding to state=2. The second ruled state can be that the available RBL count is equal to the first preset numerical value, namely $N_{rc}^{TRBL}=1$.

Figure 10:
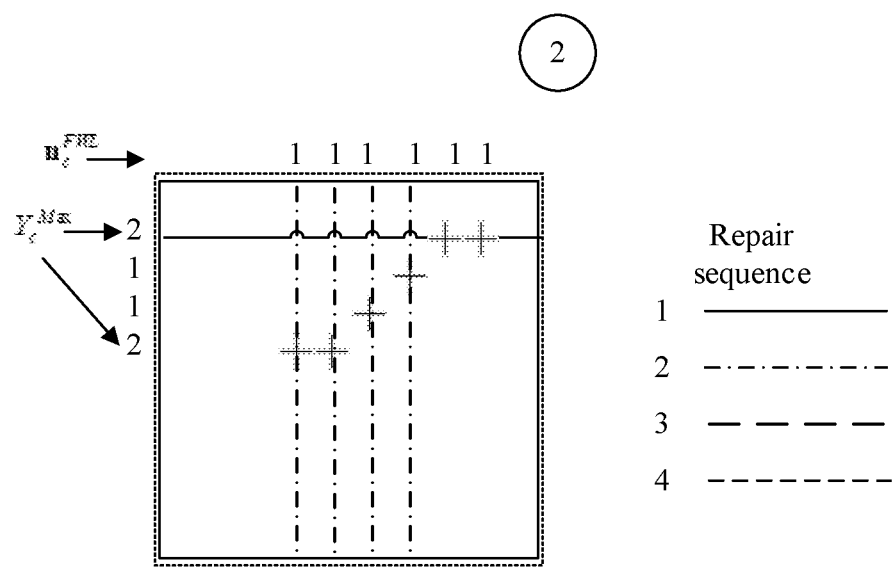
FIG. 10 schematically shows an FB feature map consistent with a second ruled state according to an exemplary implementation mode of the disclosure.

References are made to FIG. 10, which schematically shows an FB feature map consistent with a second ruled state according to an exemplary implementation mode of the disclosure. The FB feature map in FIG. 10 is consistent with the second ruled state. If the bank feature map state is consistent with the second ruled state, second repair processing in the second ruled state is performed, including the following operations. In 1, the first maximum bit position corresponding to the first BL maximum FB in the segmented feature map is acquired. In 2, first initial repair processing is triggered to be performed to repair the FB at the first maximum bit position. In 3, the state is terminated.

According to some embodiments of the disclosure, if the bank feature map state is the first initial state, whether the bank feature map state is consistent with the third ruled state in the first state set is determined, the third ruled state including that the available RBL count is greater than the first preset numerical value and the maximum WL FB count is greater than the first preset numerical value. If the bank feature map state is consistent with the third ruled state, second repair processing in the third ruled state is performed. Second repair processing in the third ruled state includes: SRR3: the first maximum bit position corresponding to the first BL maximum FB and a second maximum bit position corresponding to a second BL maximum FB in the segmented feature map are acquired respectively, and if the maximum bit position and the second maximum bit position include the same position, first initial repair processing is triggered to be performed to repair an FB at the same position; and determining in the third ruled state: whether the segmented feature map subjected to SRR3 satisfies a third determination condition, the third determination condition including that the target FB count is greater than 0, the available RBL count is greater than the first preset numerical value, and the next left RWL count is more than or equal to 0, and if the segmented feature map subjected to SRR3 satisfies the third determination condition, SRR3 is performed.

The third ruled state can be a predefined ruled state. For example, the third ruled state can be a state corresponding to state=3. The third ruled state can be that the available RBL count is greater than the first preset numerical value and the maximum WL FB count is greater than the first preset numerical value, namely $N_{rc}^{TRBL}>1$ and $\max(n_c^{FWL})>1$. The second BL maximum FB can be the maximum number of 0s that can be added or reduced in $n_c^{FWL}$ after a certain BL in the present feature map group is repaired, i.e., a BL including most FBs in the present feature map group, and can be represented by $Y_c^{MDx}$. The same position can be an overlapping position of the first maximum bit position and the second maximum bit position.

Figure 11:
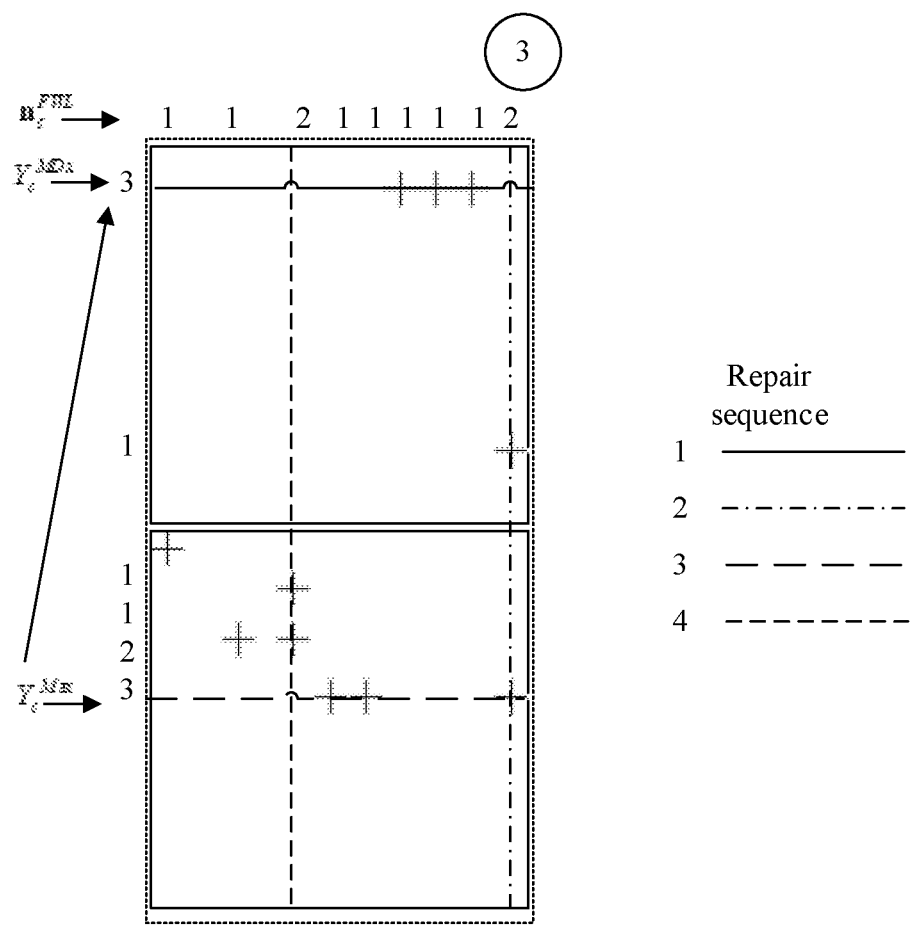
FIG. 11 schematically shows an FB feature map consistent with a third ruled state according to an exemplary implementation mode of the disclosure.

References are made to FIG. 11, which schematically shows an FB feature map consistent with a third ruled state according to an exemplary implementation mode of the disclosure. The FB feature map in FIG. 11 is consistent with the third ruled state. If the bank feature map state is consistent with the third ruled state, second repair processing in the third ruled state is performed, including SRR3 and determining in the third ruled state. The following operations are specifically executed. In 1, the first maximum bit position corresponding to the first BL maximum FB and the second maximum bit position corresponding to the second BL maximum FB in the segmented feature map are acquired respectively, namely the FBs at positions corresponding to $Y_c^{Max}$ and $Y_c^{MDx}$ are acquired respectively. In 2, whether the first maximum bit position and the second maximum bit position include the same position is determined, namely whether $Y_c^{Max} \cap Y_c^{MDx} \neq \{\ \}$ is satisfied is determined. If the positions corresponding to $Y_c^{Max}$ and $Y_c^{MDx}$ include the same position, one position is selected, and first initial repair processing is triggered to be performed to repair the FB corresponding to the position. Otherwise, the state is terminated. In 3, whether the segmented feature map subjected to SRR3 satisfies the third determination condition is determined. The third determination condition includes that the target FB count is greater than 0, the available RBL count is greater than the first preset numerical value, and the next left RWL count is more than or equal to 0, namely the third determination condition can be $N_{rc}^{FB}>0$, $N_{rc}^{TRBL}>0$, and $N_{RWL}^{(t+1)} \geq 0$. When the segmented feature map satisfies the third determination condition, 1 is continued to be executed, otherwise the state is terminated.

According to some embodiments of the disclosure, if the bank feature map state is the second initial state, whether the bank feature map state is consistent with the fourth ruled state in a second state set is determined, the fourth ruled state including that the available RBL count is greater than the first preset numerical value and the maximum WL FB count is equal to a second preset numerical value, or the available RBL count is equal to the second preset numerical value and the maximum WL FB count is greater than the first preset numerical value. If the bank feature map state is consistent with the fourth ruled state, second repair processing in the fourth ruled state is performed. Second repair processing in the fourth ruled state includes: SRR4: a third maximum bit position corresponding to a third BL maximum FB in the segmented feature map is acquired, and first initial repair processing is triggered to be performed to repair the FB at the third maximum bit position; and determining in the fourth ruled state: whether the segmented feature map subjected to SRR4 satisfies a fourth determination condition is determined, the fourth determination condition including that the target FB count is greater than 0, the available RBL count is greater than the first preset numerical value, the FBL count is greater than the first preset numerical value, the next left RWL count is more than or equal to 0, and the maximum WL FB count is equal to the second preset numerical value, and if the segmented feature map subjected to SRR4 satisfies the fourth determination condition, second repair processing in the fourth ruled state is performed.

The fourth ruled state can be a predefined ruled state. For example, the fourth ruled state can be a state corresponding to state=4. The second preset numerical value can be a preset second numerical value. For example, the second preset numerical value can be 2. The fourth ruled state can be that the available RBL count is greater than the first preset numerical value and the maximum WL FB count is equal to the second preset numerical value, or the available RBL count is equal to the second preset numerical value and the maximum WL FB count is greater than the first preset numerical value, namely the fourth ruled state is $[N_{rc}^{TRBL}>1$ and $\max(n_c^{FWL})=2]$, or $[N_{rc}^{TRBL}=2$ and $\max(n_c^{FWL})>1]$. The third BL maximum FB can be the maximum number of 0s that can be added or reduced in $n_c^{FWL}$ after one or two of some BLs in the present feature map group are repaired, and can be represented by $Y_c^{MDx2}$. The third maximum bit position is a position corresponding to $Y_c^{MDx2}$. The FBL count can be the number of FBLs in the present feature map group, and can be represented by $N_c^{FBL}$.

Figure 12:
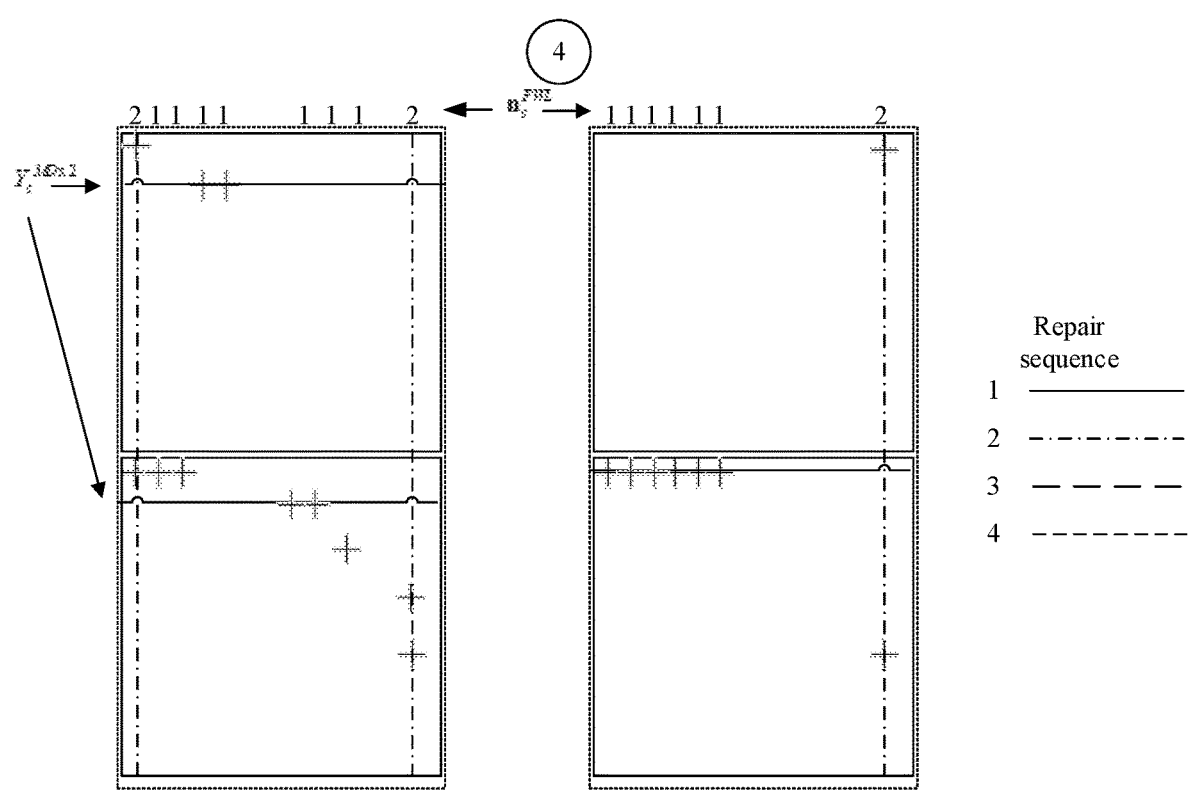
FIG. 12 schematically shows an FB feature map consistent with a fourth ruled state according to an exemplary implementation mode of the disclosure.

References are made to FIG. 12, which schematically shows an FB feature map consistent with a fourth ruled state according to an exemplary implementation mode of the disclosure. The FB feature map in FIG. 12 is consistent with the fourth ruled state. If the bank feature map state is consistent with the fourth ruled state, second repair processing in the fourth ruled state is performed, including SRR4 and determining in the fourth ruled state. The following operations are specifically executed. In 1, the third maximum bit position corresponding to the third BL maximum FB in the segmented feature map is acquired. In 2, first initial repair processing is triggered to be performed to repair the FB at the third maximum bit position. In 3, whether the segmented feature map subjected to SRR4 satisfies the fourth determination condition is determined. The fourth determination condition includes that the target FB count is greater than 0, the available RBL count is greater than the first preset numerical value, the FBL count is greater than the first preset numerical value, the next left RWL count is more than or equal to 0, and the maximum WL FB count is equal to the second preset numerical value, namely the fourth determination condition can be $N_{rc}^{FB}>0$, $N_{rc}^{TRBL}>1$, $N_c^{FBL}>1$, $N_{RWL}^{(t+1)} \geq 0$, and $\max(n_c^{FWL})=2$. If the segmented feature map satisfies the fourth determination condition, 1 is continued to be executed, otherwise the state is terminated.

According to some embodiments of the disclosure, if the bank feature map state is the first initial state, whether the bank feature map state is consistent with a fifth ruled state in the first state set is determined, the fifth ruled state including that the RBL count of the basic repair bank is more than or equal to the FBL count. If the bank feature map state is consistent with the fifth ruled state, second repair processing in the fifth ruled state is performed. Second repair processing in the fifth ruled state includes that: a position of a used RWL is acquired, a target unrepaired FB is determined according to the position of the used RWL, the target unrepaired FB including an FB at the position of the used RWL, and the target unrepaired FB is repaired using an RBL.

The fifth ruled state can be a predefined ruled state. For example, the fifth ruled state can be a state corresponding to state=5. The RBL count can be the number of RBLs in an i-th feature map in the basic repair bank, and can be represented by $N_{ri}^{RBL}$. The RBL count can be the number of FBLs in the i-th feature map in the basic repair bank, and can be represented by $N_{ri}^{FBL}$. The position of the used RWL can be a repaired RWL position. The target unrepaired FB may include an FB not at the position of the used RWL.

Figure 13:
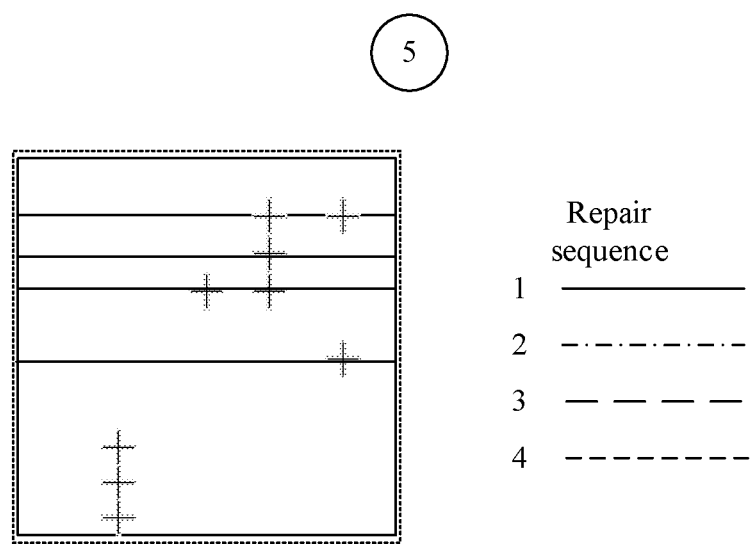
FIG. 13 schematically shows an FB feature map consistent with a fifth ruled state according to an exemplary implementation mode of the disclosure.

References are made to FIG. 13, which schematically shows an FB feature map consistent with a fifth ruled state according to an exemplary implementation mode of the disclosure. The FB feature map in FIG. 13 is consistent with the fifth ruled state. If the bank feature map state is consistent with the fifth ruled state, second repair processing in the fifth ruled state is performed. The following operations are specifically executed. In 1, the position of the used RWL is acquired. In 2, the target unrepaired FB is determined according to the position of the used RWL, and the target unrepaired FB is repaired using the RBL. In 3, the state is terminated.

In S140, an unrepaired FB in each target repair bank is determined, and candidate repair combinations of the unrepaired FBs and a candidate combination count of the candidate repair combinations are determined.

In some embodiments of the disclosure, the unrepaired FB can be an FB that is not repaired after second repair processing. The candidate repair combinations can be all possible repair combinations corresponding to repair processing of the unrepaired FBs. The candidate combination count can be the number of the candidate repair combinations.

If there are still unrepaired FBs in the chip to be repaired after first repair processing and second repair processing, these FBs are determined as unrepaired FBs. When the unrepaired FBs are determined, all the candidate repair combinations of these unrepaired FBs and the candidate combination count can further be determined. If the candidate combination count is equal to positive infinity, repair processing for the chip to be repaired is ended. If the candidate combination count is unequal to positive infinity, a next repair processing operation is continued. Specifically, a candidate combination count of the present feature map group can be calculated using formula 1.

$$\overline{c_r} = \begin{cases} \sum_{G_{rk} \in A_r} \prod_{M_{ri} \in G_k} \left[ \sum_{z=0}^{N_{ri}^{RBL}} \frac{\hat{n}_{ri}!}{z!(\hat{n}_{ri}! - z)!} \right]; \text{ if } \forall \hat{n}_{ri} \leq b_1 N_{RWL}^{(t)} + b_2. \\ \infty, \text{ otherwise} \end{cases}$$

(Formula 1)

$b_1$ may represent $N_{ij}^{FWL} \in \forall M_{ri}$, i.e., a maximum FB count corresponding to repair with each RWL in $M_{ri}$, $b_2$ may represent the number of RBLs that can be allocated in the bit feature map of the present basic repair bank. $\overline{c_r}$ may represent the candidate combination count of the target repair bank. The maximum FBL number can be a maximum number corresponding to the FB in a basic repair bank, and the maximum FBL number is recorded as $\hat{n}_{ri}$, where $\hat{n}_{ri} = \hat{n}_{ri} - 1$.

In S150, a combination count threshold is acquired, and if the candidate combination count is greater than the combination count threshold, a target repair position is determined, and repair processing is performed on the target repair position using an RWL, the target repair position being a position of an FB that maximally reduces the candidate combination count after repair processing.

In some exemplary implementation modes of the disclosure, the target repair position can be a position that the candidate combination count can be maximally reduced after repair processing is performed on the FB at the position. For solving the problem that, under the condition of considering two limiting factors of a calculation capability of a platform and effective time of a production line, no optimal repair combination for the FBs can be found and thus it is determined that the chip to be repaired may not be repaired successfully, in the disclosure, before optimal repair processing is performed on the chip to be repaired, SRR7 can be performed on a feature map group of which an FB feature map satisfies a certain state condition using an SRR manner, namely the target repair position is determined, and the RWL is allocated to perform repair processing on the target repair position.

Figure 14:
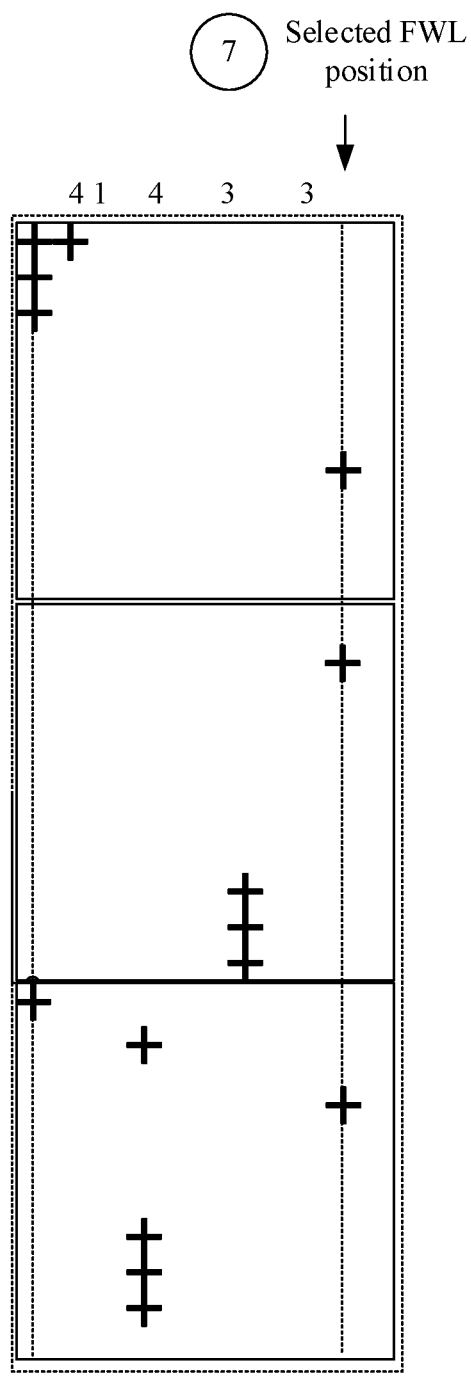
FIG. 14 schematically shows an FB feature map consistent with a seventh ruled state according to an exemplary implementation mode of the disclosure.

Through SRR7, a target repair position in a bank of which an FB feature map satisfies a preset condition can be determined. That is, if the candidate combination count is greater than the combination count threshold, and the candidate combination count is unequal to positive infinity, the target repair position can be determined according to the unrepaired FB, and the FB at the target repair position is repaired using the RWL to maximally reduce the candidate combination count. References are made to FIG. 14. FIG. 14 schematically shows an FB feature map consistent with a seventh ruled state according to an exemplary implementation mode of the disclosure. The FB feature map in FIG. 14 is consistent with the seventh ruled state. SRR7 is also called SRR with the better repair. SRR7 may determine the target repair position to maximally reduce the candidate combination count.

According to some embodiments of the disclosure, if the bank feature map state is consistent with the second initial state, and is not the second ruled state and the fourth ruled state, the present feature map group of the target repair bank is acquired, and a repair combination count corresponding to the present feature map group is calculated. If the repair combination count corresponding to the present feature map group is less than the combination count threshold, repair processing in the sixth ruled state is performed, the sixth ruled state including that the available RBL count is greater than the second preset numerical value and the maximum WL FB number is greater than the second preset numerical value. The position of a target FBL that is unrepaired in an associated feature map group is determined, the associated feature map group including a segmented feature map group and a feature map group associated with the segmented feature map group. An associated feature count of an associated feature map group positionally associated with the target FBL and unrepaired FBs are determined, and a FBL position covering most associated feature map groups and covering most unrepaired FBs is determined as the target repair position. The target repair position is repaired using the RWL, and second initial repair processing is triggered to be performed. The associated feature map group may include the segmented feature map group and the feature map group associated with the segmented feature map group.

Specifically, the bank feature map of the target repair region can be acquired first, whether the bank feature map state is consistent with the second initial state and is not the second ruled state and the fourth ruled state is determined, and if the bank feature map state is consistent with the second initial state and is not the second ruled state and the fourth ruled state, SRR7 is performed on the present feature map group in the target repair bank, including the following operations. In 1, the candidate combination count in the present feature map group is estimated using the abovementioned candidate combination count determination method, i.e., the calculation method shown in formula 1. In 2, whether the candidate combination count is equal to positive infinity is determined, and if the candidate combination count is equal to positive infinity, the repair processing process for the chip to be repaired is ended. In 3, if the repair combination count is less than the combination count threshold, repair processing in the sixth ruled state is performed, the sixth ruled state including that the available RBL count is greater than the second preset numerical value and the maximum WL FB count is greater than the second preset numerical value.

Specifically, repair processing in the sixth determined state in 3 includes the following operations. FBL numbers corresponding to the FB feature map are determined, positions corresponding to the FBL numbers are traversed one by one, and first initial repair processing is triggered to be performed. Second FB position determination is recursively performed, and acquired positions to be repaired are determined as test repair positions. Test repair costs corresponding to the test repair positions are calculated, and a minimum test repair cost and a target repair position corresponding to the minimum test repair cost are determined. Repair processing is performed on the target repair position using the redundant circuit.

The sixth ruled state can be a predefined ruled state. For example, the sixth ruled state can be a state corresponding to state=6. The sixth ruled state can be that the available RBL count is greater than the second preset numerical value and the maximum WL FB count is greater than the second preset numerical value, namely $N_{rc}^{TRBL} > 2$ and $\max(n_c^{FWL}) > 2$. The FBL number can be the number of an FBL including a FB in all feature maps in a feature map group, and can be represented by FBL number, and an initial FBL number is 0. The test repair cost can be a repair cost corresponding to repair processing performed on the FB according to the test repair position. The minimum test repair cost can be a minimum value in all test repair costs. The target repair position can be the repair position of the FB corresponding to the minimum test repair cost.

Figure 15:
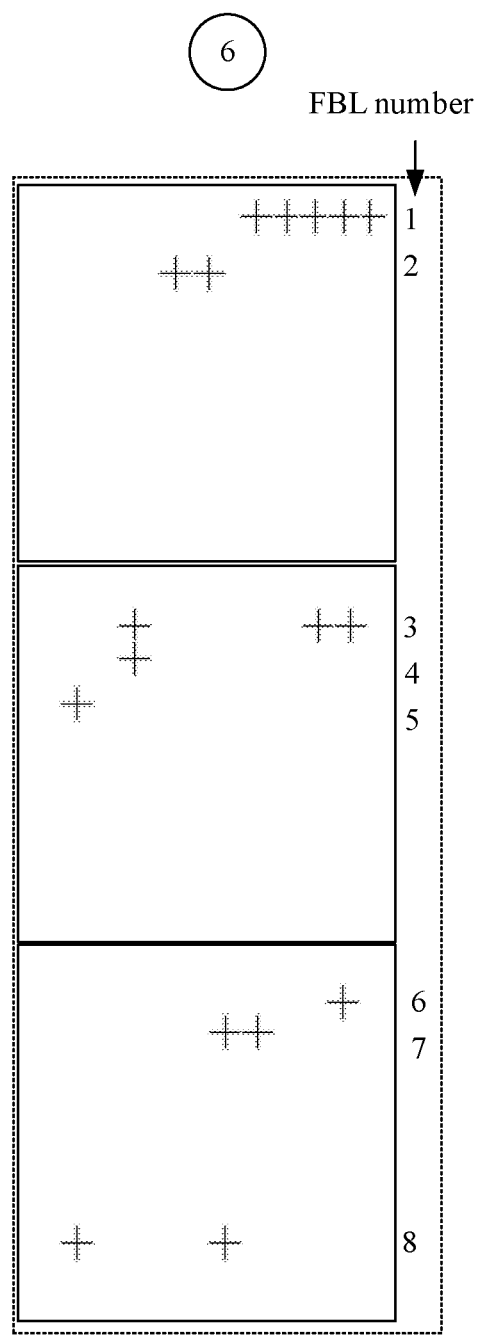
FIG. 15 schematically shows an FB feature map consistent with a sixth ruled state according to an exemplary implementation mode of the disclosure.

References are made to FIG. 15, which schematically shows an FB feature map consistent with a sixth ruled state according to an exemplary implementation mode of the disclosure. The FB feature map in FIG. 15 is consistent with the sixth ruled state. If the bank feature map state is consistent with the sixth ruled state, second repair processing in the sixth ruled state is performed. The following operations are specifically executed. In 1, the FBL numbers corresponding to the FB feature map are acquired, and variable i is set to 0. In 2, i progressively increases, the positions corresponding to the FBL numbers are traversed one by one to clear all test repair positions, the FBL numbered with i is set as a test repair position, and initial repair processing is triggered to be performed. In 3, second FB position determination is recursively performed, and all obtained positions to be repaired are determined as test repair positions. In 4, test repair costs $c^{(i)}$ corresponding to the test repair positions are calculated, and the costs and all repair positions $s^{(i)}$ are recorded. In 5, if i is equal to the maximum value in the FBL numbers, 6 continues to be executed, otherwise 2 is executed. In 6, the minimum test repair cost and the target repair position corresponding to the minimum test repair cost are determined. The target repair position can be determined as a repair position for optimal repair. Repair processing is performed on the target repair position using the redundant circuit, and the state is terminated. The test repair cost can be calculated using formula 2.

$$f^c(s, N_{RWL}^{(t)}) = \begin{cases} b_3 n_{RWL}^{(t)} + n_{RBL}^{(t)}, & \text{if } N_{RWL}^{(t)} - n_{RWL}^{(t)} \geq 0; \\ \infty, & \text{otherwise} \end{cases} \quad \text{(Formula 2)}$$

$b_3$ can be $$\sum_i N_{ri}^{RBL},$$

i.e., a total RBL count of each target repair bank. $n_{RBL}^{(t)}$ can be the number of RBLs that have been used in the test repair position $s^{(i)}$. $n_{RWL}^{(t)}$ can be the number of RWLs that have been used in the test repair position $s^{(i)}$.

In 4, the RBL position of the unrepaired RBL in the associated feature map group is determined, namely positions of target RBLs of all associated and unrepaired Fail WLs (FWLs) are determined, and the number of the feature maps associated with the target FBL and the number (i.e., $n_c^{FWL}$) of the unrepaired FBs are determined. In 5, the FWL position covering the largest number of associated feature maps and covering the largest number of unrepaired FBs is determined as the target repair position, the target repair position is repaired using the RWL, and second initial repair processing is triggered to be performed.

According to some embodiments of the disclosure, the bank feature map state is acquired. If the bank feature map state is consistent with a target ruled state, the bank feature map state is switched to the first initial state, the target ruled state including that the target FBL count is greater than 0, the available RBL count is greater than 0, and the present left RWL count is more than or equal to 0.

In 6, after 1 to 5 are completed, the bank feature map state can be acquired, and whether the bank feature map state is consistent with the target ruled state is determined. The target ruled state includes that the target FB count is greater than 0, the available RBL count is more than or equal to 0, and the present left RWL count is more than or equal to 0, the target ruled state can be $N_{rc}^{FB} > 0$, $N_{rc}^{TRBL} > 0$, and $N_{RWL}^{(t+1)} \geq 0$. If the bank feature map state is inconsistent with the target ruled state, the bank feature map state is switched to the first initial state. Otherwise, the state is terminated.

It is to be noted that terms "first", "second", "third", "fourth", "fifth", "sixth", "seventh", "eighth", etc., used in the disclosure are only for distinguishing different FBs, different repair processing, different preset conditions, different initial states, different ruled states, different preset numerical values, different determination conditions, different repair priorities, etc., and not intended to correspondingly limit the disclosure.

In the embodiment of the disclosure, on one aspect, first repair processing and second repair processing can be performed on the FBs using the redundant circuit to reduce the number of the FBs in the chip to be repaired effectively to perform optimal repair processing on the chip to be repaired. On another aspect, the target repair position is determined, and repair processing is performed on the target repair position, such that the candidate combination count can be reduced maximally to increase the repair processing speed of repairing the FBs. On a third aspect, repair processing can be performed on the target repair position to effectively solve the problem that no optimal repair combination for the FBs can be found and thus it is determined that the chip to be repaired may not be repaired successfully.

Figure 16:
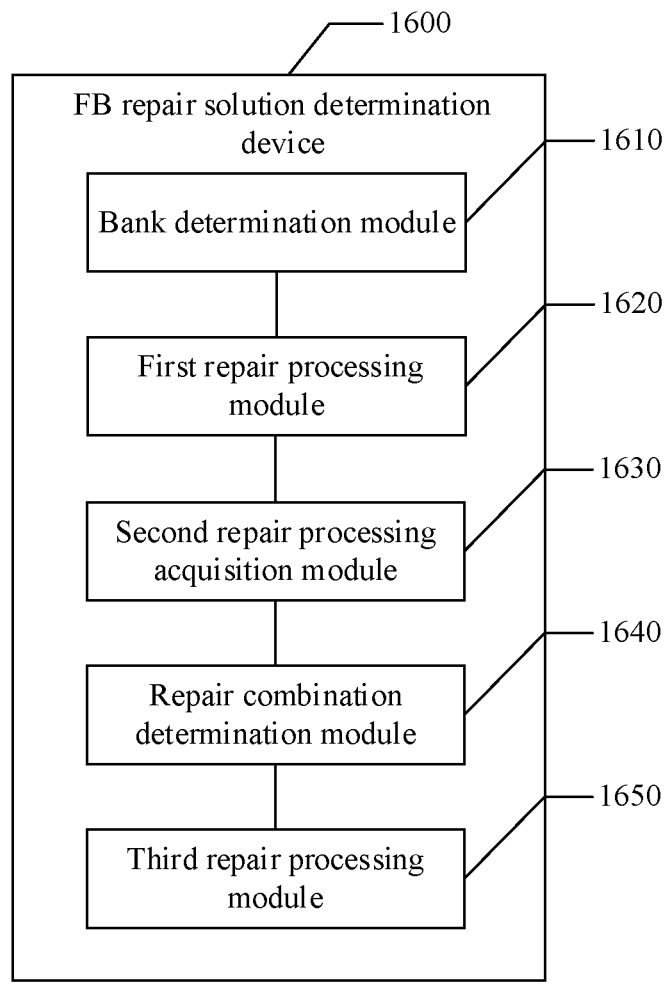
FIG. 16 schematically shows a block diagram of an FB repair device according to an exemplary implementation mode of the disclosure.

In addition, there is also provided in an embodiment an FB repair device. Referring to FIG. 16, the FB repair device 1600 may include a bank determination module 1610, a first repair processing module 1620, a second repair processing module 1640, a repair combination determination module 1640, and a third repair processing module 1650.

Specifically, the bank determination module 1610 is configured to determine a bank to be repaired of a chip to be repaired, the bank to be repaired including multiple target repair banks. The first repair processing module 1620 is configured to perform first repair processing on a first FB in each target repair bank using a redundant circuit. The second repair processing module 1630 is configured to, after first repair processing is performed, perform second FB position determination to determine a bit position of a second FB in each target repair bank, and perform second repair processing on the second FB according to the bit position of the second FB. The repair combination determination module 1640 is configured to determine an unrepaired FB in each target repair bank, and determine candidate repair combinations of the unrepaired FBs and a candidate combination count of the candidate repair combinations. The third repair processing module 1650 is configured to acquire a combination count threshold, and if the candidate combination count is greater than the combination count threshold, determine a target repair position and perform repair processing on the target repair position using an RWL, the target repair position being a position of an FB that maximally reduces the candidate combination count after repair processing.

The FB repair device 1600 may perform first repair processing and second repair processing on the FBs using the redundant circuit to reduce the number of the FBs in the chip to be repaired effectively to perform optimal repair processing on the chip to be repaired. The target repair position is determined, and repair processing is performed on the target repair position, such that the candidate combination count can be reduced maximally to increase the repair processing speed of repairing the FBs. Moreover, the problem that no optimal repair combination for the FBs can be found and thus it is determined that the chip to be repaired may not be repaired successfully can be solved effectively.

In an exemplary implementation solution of the disclosure, the FB repair device further includes a bank division module, configured to determine an initial bank to be repaired of the chip to be repaired, the initial bank to be repaired including an initial WL and an initial Bl; acquire a WL compression ratio and BL compression ratio of the initial bank to be repaired; perform compression processing on the initial WL according to the WL compression ratio and on the initial BL according to the BL compression ratio to form the bank to be repaired; determine a division column of the bank to be repaired, a width of the division column being determined according to the number of row-direction equivalent bits in a DQ after compression processing; and perform column division processing on the bank to be repaired according to the division column to form the multiple target repair banks.

In an exemplary implementation solution of the disclosure, the first repair processing module includes a first repair processing unit, configured to determine a FB feature map of the target repair bank, and perform first repair processing on a FB in each target repair bank using the redundant circuit according to the FB feature map.

In an exemplary implementation solution of the disclosure, the first repair processing unit includes a feature map determination subunit, configured to: divide the target repair bank into multiple basic repair banks, the basic repair bank including a preset number of DQs; acquire the basic repair banks, and determine bit states of all bits in the basic repair banks; perform OR operation processing on the bit states in every preset number of DQs, and generate FB maps of the basic repair banks by merging; and generate the FB feature map according to the FB map corresponding to each basic repair bank.

In an exemplary implementation solution of the disclosure, the first repair processing unit includes a first repair processing subunit, configured to perform determining: determining whether the FB feature map satisfies a preset condition, the preset condition including a first preset condition and a second preset condition; perform first initial repair processing: if the FB feature map satisfies the first preset condition, performing repair processing on the FB using the RWL, the first preset condition including that an FB count of a first numbered WL in the basic repair bank is greater than a present left RBL count of the basic repair bank; and perform second initial repair processing: if the FB feature map satisfies the second preset condition, performing repair processing on the FB using the RBL, the second preset condition including that an FB count of a first numbered BL in the basic repair bank is greater than a present left RWL count of the basic repair bank.

In an exemplary implementation solution of the disclosure, the FB repair device further includes an initial condition determining module, configured to: acquire the FB feature map of the target repair bank, and determine a target FB count, available RBL count, and present left RWL count of the target repair bank; if the target repair bank satisfies an initial determination condition, end an repair processing operation for the chip to be repaired, the initial determination condition including that the target FB count is equal to 0, or the available RBL count is equal to 0, or the present left RWL count is less than 0; if the target repair bank does not satisfy the initial determination condition, perform segmentation processing on the FB feature map according to an association relationship to generate a segmented feature map group, the segmented feature map group including a segmented feature map; and if the bank feature map state of the target repair bank is a second initial state and a new FB feature map is generated in the segmented feature map group, adjust the second initial state to a first initial state.

In an exemplary implementation solution of the disclosure, the second repair processing module includes an SSR1 unit, configured to: if the bank feature map state is the first initial state, determine whether the bank feature map state is consistent with a first ruled state in a first state set, the first ruled state including that the available RBL count is greater than a first preset numerical value and a maximum WL FB count is equal to the first preset numerical value, and if the bank feature map state is consistent with the first ruled state, perform second repair processing in the first ruled state.

Second repair processing in the first ruled state includes:
SRR1: acquiring a first maximum bit position corresponding to a first BL maximum FB in the segmented feature map, and triggering first initial repair processing to be performed to repair the FB at the first maximum bit position; and
    determining in the first ruled state: determining whether the segmented feature map subjected to SSR1 satisfies a first determination condition, the first determination condition including that the target FB count is greater than 0, the available RBL count is greater than 0, and a next left RWL count is more than or equal to 0, and if the segmented feature map subjected to SRR1 satisfies the first determination condition, performing SRR1.

In an exemplary implementation solution of the disclosure, the second repair processing module includes an SRR2 unit, configured to: if the bank feature map state is the first initial state, determine whether the bank feature map state is consistent with a second ruled state in the first state set, the second ruled state including that the available RBL count is equal to the first preset numerical value, and if the bank feature map state is consistent with the second ruled state, perform second repair processing in the second ruled state.

Second repair processing in the second ruled state includes: acquiring the first maximum bit position corresponding to the first BL maximum FB in the segmented feature map, and triggering first initial repair processing to be performed to repair the FB at the first maximum bit position.

In an exemplary implementation solution of the disclosure, the second repair processing module includes an SRR3 unit, configured to: if the bank feature map state is the first initial state, determine whether the bank feature map state is consistent with a third ruled state in the first state set, the third ruled state including that the available RBL count is greater than the first preset numerical value and the maximum WL FB count is greater than the first preset numerical value, and if the bank feature map state is consistent with the third ruled state, perform second repair processing in the third ruled state.

Second repair processing in the third ruled state includes: SRR3: acquiring the first maximum bit position corresponding to the first BL maximum FB and a second maximum bit position corresponding to a second BL maximum FB in the segmented feature map respectively, and if the maximum bit position and the second maximum bit position include the same position, triggering first initial repair processing to be performed to repair an FB at the same position; and determining in the third ruled state: determining whether the segmented feature map subjected to SRR3 satisfies a third determination condition, the third determination condition including that the target FB count is greater than 0, the available RBL count is greater than the first preset numerical value, and the next left RWL count is more than or equal to 0, and if the segmented feature map subjected to SRR3 satisfies the third determination condition, performing SRR3.

In an exemplary implementation solution of the disclosure, the second repair processing module includes an SRR4 unit, configured to: if the bank feature map state is the second initial state, determine whether the bank feature map state is consistent with a fourth ruled state in a second state set, the fourth ruled state including that the available RBL count is greater than the first preset numerical value and the maximum WL FB count is equal to a second preset numerical value, or the available RBL count is equal to the second preset numerical value and the maximum WL FB count is greater than the first preset numerical value, and if the bank feature map state is consistent with the fourth ruled state, perform second repair processing in the fourth ruled state.

Second repair processing in the fourth ruled state includes: SRR4: acquiring a third maximum bit position corresponding to a third BL maximum FB in the segmented feature map, and triggering first initial repair processing to be performed to repair the FB at the third maximum bit position; and determining in the fourth ruled state: determining whether the segmented feature map subjected to SRR4 satisfies a fourth determination condition, the fourth determination condition including that the target FB count is greater than 0, the available RBL count is greater than the first preset numerical value, the FBL count is greater than the first preset numerical value, the next left RWL count is more than or equal to 0, and the maximum WL FB count is equal to the second preset numerical value, and if the segmented feature map subjected to SRR4 satisfies the fourth determination condition, performing second repair processing in the fourth ruled state.

In an exemplary implementation solution of the disclosure, the second repair processing module includes an SRR5 unit, configured to: if the bank feature map state is the first initial state, determine whether the bank feature map state is consistent with a fifth ruled state in the first state set, the fifth ruled state including that the RBL count of the basic repair bank is more than or equal to the FBL count, and if the bank feature map state is consistent with the fifth ruled state, perform second repair processing in the fifth ruled state.

Second repair processing in the fifth ruled state includes: acquiring a position of a used RWL, determining a target unrepaired FB according to the position of the used RWL, the target unrepaired FB including an FB at the position of the used RWL, and repairing the target unrepaired FB using an RBL.

In an exemplary implementation solution of the disclosure, the third repair processing module includes a third repair processing unit, configured to: if the bank feature map state is consistent with the second initial state, and is not the second ruled state and the fourth ruled state, acquire a present feature map group of the target repair bank, and calculate a repair combination count corresponding to the present feature map group; if the repair combination count corresponding to the present feature map group is less than the combination count threshold, perform repair processing in a sixth ruled state, the sixth ruled state including that the available RBL count is greater than the second preset numerical value and the maximum WL FB number is greater than the second preset numerical value; determine a position of a target FBL that is unrepaired in an associated feature map group, the associated feature map group including a segmented feature map group and a feature map group associated with the segmented feature map group; determine an associated feature map count of an associated feature map group positionally associated with the target FBL and unrepaired FBs, and determine an FBL position covering most associated feature map groups and covering most unrepaired FBs as the target repair position; and repair the target repair position using the RWL, and trigger second initial repair processing to be performed. In an exemplary implementation solution of the disclosure, the third repair processing unit includes an SRR6 unit, configured to: determine FBL numbers corresponding to the FB feature map, traverse positions corresponding to the FBL numbers one by one, and trigger first initial repair processing to be performed; recursively perform second FB position determination, and determine acquired positions to be repaired as test repair positions; calculate test repair costs corresponding to the test repair positions, and determine a minimum test repair cost and a target repair position corresponding to the minimum test repair cost; and perform repair processing on the target repair position using the redundant circuit.

In an exemplary implementation solution of the disclosure, the FB repair device further includes a state switching module, configured to acquire the bank feature map state, and if the bank feature map state is consistent with a target ruled state, switch the bank feature map state to the first initial state, the target ruled state including that a target FBL count is greater than 0, the available RBL count is greater than 0, and the present left RWL count is more than or equal to 0.

Specific details about each virtual module of the FB repair device have been described in detail in the corresponding FB repair method, and thus elaborations are omitted herein.

It is to be noted that, although a plurality of modules or units of the FB repair device are mentioned in the above detailed descriptions, such division is not mandatory. In practice, features and functions of two or more modules described above can be embodied in one module or unit according to the implementation modes of the disclosure. Conversely, the feature and function of one module or unit described above may further be divided into multiple modules or units for embodiment.

In addition, the drawings are only schematic descriptions about processing in the method according to the exemplary embodiments of the disclosure and not for a purpose of limitation. It is easily understood that processing shown in the drawings does not indicate or limit the time sequence of the processing. In addition, it is also easily understood that such processing can be performed, for example, in multiple modules at the same time or at different time.

Other embodiments of the disclosure are apparent to those skilled in the art after considering the specification and practicing the disclosure disclosed here. The application is intended to cover any transformations, uses or adaptive variations of the disclosure, and these transformations, uses or adaptive variations follow the general principle of the disclosure, and include common general knowledge or conventional technical means undisclosed in the disclosure in the technical field. The specification and the embodiments are only considered as examples, and the practical scope and spirit of the disclosure are pointed out by the claims.

It should be understood that the disclosure is not limited to the precise structures described above and shown in the drawings, and various modifications and variations may be made without departing from the scope thereof. The scope of the disclosure is only defined by the appended claims.

What is claimed is:

1. A Fail Bit (FB) repair method, comprising:
determining a bank to be repaired of a chip to be repaired, the bank to be repaired comprising multiple target repair banks, wherein the multiple target repair banks are obtained by dividing the bank to be repaired;
performing first repair processing on a first FB in each target repair bank using a redundant circuit;
after the first repair processing is performed, performing second FB position determination to determine a bit position of a second FB in each target repair bank, and performing second repair processing on the second FB according to the bit position of the second FB;
determining an unrepaired FB in each target repair bank, and determining candidate repair combinations of unrepaired FBs and a candidate combination count of the candidate repair combinations; and
acquiring a combination count threshold, and in a case that the candidate combination count is greater than the combination count threshold, determining a target repair position and performing repair processing on the target repair position using a Redundant Word-Line (RWL), the target repair position being a position of an FB that maximally reduces the candidate combination count after repair processing,
wherein said determining the target repair position and performing the repair processing on the target repair position using the RWL comprises:
if a bank feature map state is consistent with a second initial state, and is not a second ruled state and a fourth ruled state, acquiring a present feature map group of the target repair bank, and calculating a repair combination count corresponding to the present feature map group;
if the repair combination count corresponding to the present feature map group is less than the combination count threshold, performing repair processing in a sixth ruled state, the sixth ruled state comprising that an available RBL count is greater than a second preset numerical value and a maximum Word Line (WL) FB number is greater than the second preset numerical value;
determining a position of a target Fail Bit Line (FBL) that is unrepaired in an associated feature map group, the associated feature map group comprising a segmented feature map group and a feature map group associated with the segmented feature map group;
determining an associated feature map count of an associated feature map group positionally associated with the target FBL and unrepaired FBs, and determining an FBL position covering most associated feature map groups and covering most unrepaired FBs as the target repair position; and
repairing the target repair position using the RWL, and triggering second initial repair processing to be performed.

2. The method of claim 1, prior to said determining the bank to be repaired of the chip to be repaired, further comprising:
determining an initial bank to be repaired of the chip to be repaired, the initial bank to be repaired comprising an initial Word Line (WL) and an initial Bit Line (BL);
acquiring a WL compression ratio and BL compression ratio of the initial bank to be repaired;
performing compression processing on the initial WL according to the WL compression ratio, and performing compression processing on the initial BL according to the BL compression ratio, to form the bank to be repaired;
determining a division column of the bank to be repaired, a width of the division column being determined according to the number of row-direction equivalent bits in a Data Queue (DQ) after compression processing; and
performing column division processing on the bank to be repaired according to the division column to form the multiple target repair banks.

3. The method of claim 1, wherein said performing first repair processing on the first FB in each target repair bank using the redundant circuit comprises:
determining an FB feature map of the target repair bank; and
performing first repair processing on an FB in each target repair bank using the redundant circuit according to the FB feature map.

4. The method of claim 3, wherein said determining the FB feature map of the target repair bank comprises:
dividing the target repair bank into multiple basic repair banks, the multiple basic repair banks comprising a preset number of DQs;
acquiring the multiple basic repair banks, and determining bit states of all bits in the multiple basic repair banks;
performing OR operation processing on the bit states in every preset number of DQs, and generating FB maps of the multiple basic repair banks by merging; and
generating the FB feature map according to the FB map corresponding to each basic repair bank.

5. The method of claim 3, wherein the redundant circuit comprises an RWL and a Redundant Bit-Line (RBL), and performing first repair processing on the FB in each target repair bank using the redundant circuit according to the FB feature map comprises:
a determining step: determining whether the FB feature map satisfies a preset condition, the preset condition comprising a first preset condition and a second preset condition;
first initial repair processing: if the FB feature map satisfies the first preset condition, performing repair processing on the FB using the RWL, the first preset condition comprising that an FB count of a first numbered WL in a basic repair bank is greater than a present left RBL count of the basic repair bank; and
second initial repair processing: in a case that the FB feature map satisfies the second preset condition, performing repair processing on the FB using the RBL, the second preset condition comprising that an FB count of a first numbered BL in the basic repair bank is greater than a present left RWL count of the basic repair bank.

6. The method of claim 1, prior to said performing second FB position determination to determine the bit position of the second FB in each target repair bank, further comprising:
acquiring the FB feature map of the target repair bank, and determining a target FB count, the available RBL count, and a present left RWL count of the target repair bank;
if the target repair bank satisfies an initial determination condition, ending a repair processing operation for the chip to be repaired, the initial determination condition comprising that a target FB count is equal to 0, or the available RBL count is equal to 0, or the present left RWL count is less than 0;
if the target repair bank does not satisfy the initial determination condition, performing segmentation processing on the FB feature map according to an association relationship to generate the segmented feature map group, the segmented feature map group comprising a segmented feature map; and
if the bank feature map state of the target repair bank is the second initial state and a new FB feature map is generated in the segmented feature map group, adjusting the second initial state to a first initial state.

7. The method of claim 6, wherein said performing second FB position determination to determine the bit position of the second FB in each target repair bank and performing second repair processing on the second FB according to the bit position of the second FB comprises:
if the bank feature map state is the first initial state, determining whether the bank feature map state is consistent with a first ruled state in a first state set, the first ruled state comprising that the available RBL count is greater than a first preset numerical value and the maximum WL FB count is equal to the first preset numerical value; and
if the bank feature map state is consistent with the first ruled state, performing second repair processing in the first ruled state,
wherein second repair processing in the first ruled state comprises:
State Ruling Repair 1 (SRR1): acquiring a first maximum bit position corresponding to a first BL maximum FB in the segmented feature map, and
triggering first initial repair processing to be performed to repair the FB at the first maximum bit position; and
a determining step in the first ruled state: determining whether the segmented feature map subjected to SRR1 satisfies a first determination condition, the first determination condition comprising that the target FB count is greater than 0, the available RBL count is greater than 0, and a next left RWL count is more than or equal to 0, and
if the segmented feature map subjected to SRR1 satisfies the first determination condition, performing SRR1.

8. The method of claim 6, wherein said performing second FB position determination to determine the bit position of the second FB in each target repair bank and performing second repair processing on the second FB according to the bit position of the second FB comprises:
if the bank feature map state is the first initial state, determining whether the bank feature map state is consistent with the second ruled state in a first state set, the second ruled state comprising that the available RBL count is equal to a first preset numerical value; and
if the bank feature map state is consistent with the second ruled state, performing second repair processing in the second ruled state,
wherein second repair processing in the second ruled state comprises:
acquiring a first maximum bit position corresponding to a first BL maximum FB in the segmented feature map; and
triggering first initial repair processing to be performed to repair the FB at the first maximum bit position.

9. The method of claim 6, wherein said performing second FB position determination to determine the bit position of the second FB in each target repair bank and performing second repair processing on the second FB according to the bit position of the second FB comprises:
if the bank feature map state is the first initial state, determining whether the bank feature map state is consistent with a third ruled state in a first state set, the third ruled state comprising that the available RBL count is greater than a first preset numerical value and the maximum WL FB count is greater than the first preset numerical value; and
if the bank feature map state is consistent with the third ruled state, performing second repair processing in the third ruled state,
wherein second repair processing in the third ruled state comprises:
State Ruling Repair 3: acquiring a first maximum bit position corresponding to a first BL maximum FB and a second maximum bit position corresponding to a second BL maximum FB in the segmented feature map respectively, and
if the first maximum bit position and the second maximum bit position comprise a same position, triggering first initial repair processing to be performed to repair an FB at the same position; and
a determining step in the third ruled state: determining whether the segmented feature map subjected to SRR3 satisfies a third determination condition, the third determination condition comprising that the target FB count is greater than 0, the available RBL count is greater than the first preset numerical value, and a next left RWL count is more than or equal to 0, and
if the segmented feature map subjected to SRR3 satisfies the third determination condition, performing SRR3.

10. The method of claim 6, wherein said performing second FB position determination to determine the bit position of the second FB in each target repair bank and performing second repair processing on the second FB according to the bit position of the second FB comprises:
if the bank feature map state is the second initial state, determining whether the bank feature map state is consistent with the fourth ruled state in a second state set, the fourth ruled state comprising that the available RBL count is greater than a first preset numerical value and the maximum WL FB count is equal to the second preset numerical value, or the available RBL count is equal to the second preset numerical value and the maximum WL FB count is greater than the first preset numerical value; and
if the bank feature map state is consistent with the fourth ruled state, performing second repair processing in the fourth ruled state,
wherein second repair processing in the fourth ruled state comprises:

State Ruling Repair 4 (SRR4): acquiring a third maximum bit position corresponding to a third BL maximum FB in the segmented feature map, and triggering first initial repair processing to be performed to repair the FB at the third maximum bit position; and a determining step in the fourth ruled state: determining whether the segmented feature map subjected to SRR4 satisfies a fourth determination condition, the fourth determination condition comprising that the target FB count is greater than 0, the available RBL count is greater than the first preset numerical value, an FBL count is greater than the first preset numerical value, a next left RWL count is more than or equal to 0, and the maximum WL FB count is equal to the second preset numerical value, and if the segmented feature map subjected to SRR4 satisfies the fourth determination condition, performing second repair processing in the fourth ruled state.

11. The method of claim 6, wherein said performing second FB position determination to determine the bit position of the second FB in each target repair bank and performing second repair processing on the second FB according to the bit position of the second FB comprises:

if the bank feature map state is the first initial state, determining whether the bank feature map state is consistent with a fifth ruled state in the first state set, the fifth ruled state comprising that an RBL count of a basic repair bank is more than or equal to an FBL count; and if the bank feature map state is consistent with the fifth ruled state, performing second repair processing in the fifth ruled state, wherein the second repair processing in the fifth ruled state comprises:

acquiring a position of a used RWL, determining a target unrepaired FB according to a position of the used RWL, the target unrepaired FB comprising an FB at the position of the used RWL, and repairing the target unrepaired FB using an RBL.

12. The method of claim 1, wherein said performing repair processing in the sixth ruled state comprises:

determining FBL numbers corresponding to the FB feature map, traversing positions corresponding to the FBL numbers one by one, and triggering first initial repair processing to be performed;

recursively performing second FB position determination, and determining acquired positions to be repaired as test repair positions;

calculating test repair costs corresponding to the test repair positions, and determining a minimum test repair cost and a target repair position corresponding to the minimum test repair cost; and performing repair processing on the target repair position using the redundant circuit.

13. The method of claim 1, after said repairing the target repair position using the RWL and triggering second initial repair processing to be performed, further comprising:

acquiring the bank feature map state; and if the bank feature map state is consistent with a target ruled state, switching the bank feature map state to the first initial state, the target ruled state comprising that a target FBL count is greater than 0, the available RBL count is greater than 0, and a present left RWL count is more than or equal to 0.

14. A Fail Bit (FB) repair device, comprising:

a bank determination module, configured to determine a bank to be repaired of a chip to be repaired, the bank to be repaired comprising multiple target repair banks, wherein the multiple target repair banks are obtained by dividing the bank to be repaired;

a first repair processing module, configured to perform first repair processing on a first FB in each target repair bank using a redundant circuit;

a second repair processing module, configured to, after first repair processing is performed, perform second FB position determination to determine a bit position of a second FB in each target repair bank, and perform second repair processing on the second FB according to the bit position of the second FB; and a repair combination determination module, configured to determine an unrepaired FB in each target repair bank, and determine candidate repair combinations of unrepaired FBs and a candidate combination count of the candidate repair combinations; and a third repair processing module, configured to acquire a combination count threshold, and if the candidate combination count is greater than the combination count threshold, determine a target repair position and perform repair processing on the target repair position using a Redundant Word-Line (RWL), the target repair position being a position of an FB that maximally reduces the candidate combination count after repair processing, wherein the third repair processing module is further configured to:

if a bank feature map state is consistent with a second initial state, and is not a second ruled state and a fourth ruled state, acquire a present feature map group of the target repair bank, and calculate a repair combination count corresponding to the present feature map group;

if the repair combination count corresponding to the present feature map group is less than the combination count threshold, perform repair processing in a sixth ruled state, the sixth ruled state comprising that an available RBL, count is greater than a second preset numerical value and a maximum Word Line (WL) FB number is greater than the second preset numerical value;

determine a position of a target Fail Bit Line (FBL) that is unrepaired in an associated feature map group, the associated feature map group comprising a segmented feature map group and a feature map group associated with the segmented feature map group;

determine an associated feature map count of an associated feature map group positionally associated with the target FBL and unrepaired FBs, and determine an FBL position covering most associated feature map groups and covering most unrepaired FBs as the target repair position; and repair the target repair position using the RWL, and trigger second initial repair processing to be performed.

* * * * *